(12) United States Patent
Kikuchi et al.

(10) Patent No.: US 11,651,720 B2
(45) Date of Patent: May 16, 2023

(54) DISPLAY DEVICE, METHOD OF DRIVING DISPLAY DEVICE, AND ELECTRONIC APPARATUS

(71) Applicant: SONY GROUP CORPORATION, Tokyo (JP)

(72) Inventors: Ken Kikuchi, Tokyo (JP); Takaaki Sugiyama, Kanagawa (JP)

(73) Assignee: SONY GROUP CORPORATION, Tokyo (JP)

( * ) Notice: Subject to any disclaimer, the term of this patent is extended or adjusted under 35 U.S.C. 154(b) by 0 days.

(21) Appl. No.: 17/606,992

(22) PCT Filed: Apr. 7, 2020

(86) PCT No.: PCT/JP2020/015666
§ 371 (c)(1),
(2) Date: Oct. 27, 2021

(87) PCT Pub. No.: WO2020/226016
PCT Pub. Date: Nov. 12, 2020

(65) Prior Publication Data
US 2022/0208066 A1    Jun. 30, 2022

(30) Foreign Application Priority Data

May 7, 2019  (JP) .............................. JP2019-087519

(51) Int. Cl.
*G09G 3/20* (2006.01)
*G09G 3/3233* (2016.01)
(Continued)

(52) U.S. Cl.
CPC ......... *G09G 3/2007* (2013.01); *G09G 3/3233* (2013.01); *G09G 3/2014* (2013.01);
(Continued)

(58) Field of Classification Search
CPC ...... G09G 3/2007; G09G 3/32; G09G 3/3208; G09G 3/3225; G09G 3/3233;
(Continued)

(56) References Cited

U.S. PATENT DOCUMENTS

| 8,217,865 B2 * | 7/2012 | Tada | G09G 3/3233 345/82 |
| 8,508,441 B2 * | 8/2013 | Kimura | G09G 3/3233 345/77 |

(Continued)

FOREIGN PATENT DOCUMENTS

| JP | 2007-333768 | 12/2007 |
| JP | 2011-048101 | 3/2011 |

(Continued)

OTHER PUBLICATIONS

International Search Report prepared by the Japan Patent Office dated Jun. 17, 2020, for International Application No. PCT/JP2020/015666, 3 pgs.

*Primary Examiner* — Tom V Sheng
(74) *Attorney, Agent, or Firm* — Sheridan Ross P.C.

(57) ABSTRACT

A display device of the present disclosure is provided with a pixel circuit that includes a light-emitting element; a current modulator that controls a current value flowing through the light-emitting element; a current breaker that interrupts a current flowing through the light-emitting element; and a gray-scale controller that controls the current modulator and the current breaker to perform gray-scale control. The gray-scale controller discretely controls a light emission duty of the light-emitting element through the current breaker, and controls, through the current modulator, the current value flowing through the light-emitting element in accordance with the light emission duty of the light-emitting element.

14 Claims, 17 Drawing Sheets

(51) Int. Cl.
*G09G 3/3208* (2016.01)
*G09G 3/3225* (2016.01)
*G09G 3/32* (2016.01)

(52) U.S. Cl.
CPC ............. *G09G 3/32* (2013.01); *G09G 3/3208* (2013.01); *G09G 3/3225* (2013.01); *G09G 2310/0243* (2013.01); *G09G 2310/06* (2013.01); *G09G 2320/0242* (2013.01)

(58) Field of Classification Search
CPC ......... G09G 3/2014; G09G 2310/0243; G09G 2310/06; G09G 2310/066; G09G 2310/0262; G09G 2320/0242
USPC .......................................................... 345/691
See application file for complete search history.

(56) References Cited

U.S. PATENT DOCUMENTS

| | | | |
|---|---|---|---|
| 11,100,849 B1* | 8/2021 | Yang | G09G 3/32 |
| 2005/0057455 A1* | 3/2005 | Peng | G09G 3/3208 345/76 |
| 2006/0279492 A1* | 12/2006 | Chen | G09G 3/3216 345/77 |
| 2008/0185971 A1 | 8/2008 | Kinoshita | |
| 2008/0246749 A1* | 10/2008 | Lee | G09G 3/3233 345/207 |
| 2011/0050761 A1 | 3/2011 | Yoneyama | |
| 2011/0069096 A1 | 3/2011 | Li et al. | |
| 2014/0125714 A1* | 5/2014 | Pyo | G09G 3/3233 345/691 |
| 2015/0062195 A1* | 3/2015 | Kumeta | G09G 3/3233 345/77 |
| 2017/0061878 A1* | 3/2017 | Park | G09G 3/3233 |
| 2018/0293929 A1 | 10/2018 | Shigeta et al. | |
| 2020/0135147 A1* | 4/2020 | Tang | G09G 3/3208 |
| 2020/0349885 A1* | 11/2020 | Hsieh | G09G 3/2025 |
| 2021/0350742 A1* | 11/2021 | Choi | G09G 3/32 |

FOREIGN PATENT DOCUMENTS

| | | |
|---|---|---|
| JP | 2011-070184 | 4/2011 |
| WO | WO 2005/106835 | 11/2005 |
| WO | WO 2018/164105 | 9/2018 |

* cited by examiner

STEP-WISE SAWTOOTH WAVE SIGNAL SAW

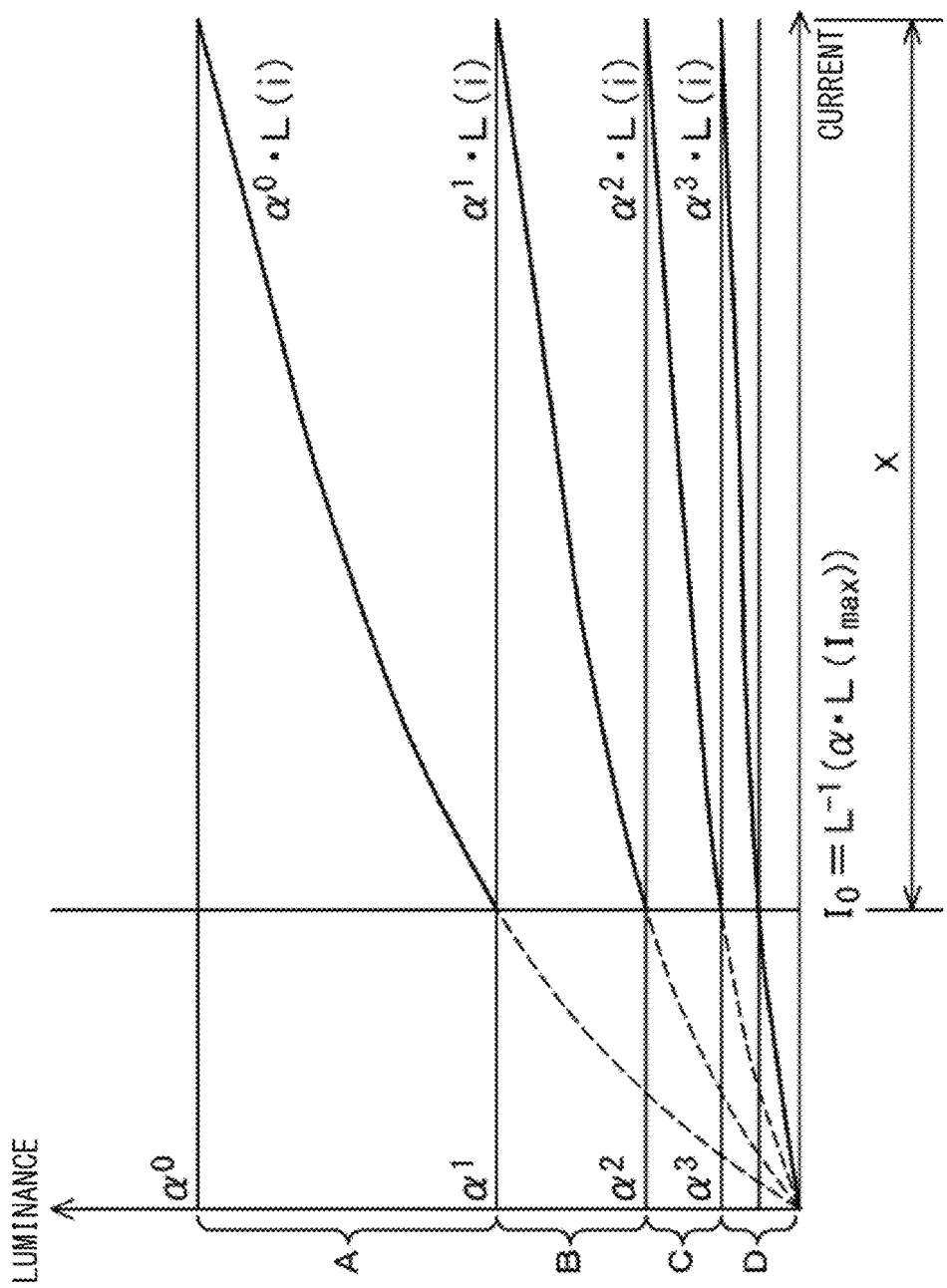

STREAK

BLURRING WIDTH

BLURRING WIDTH

NORMAL MODE

REPHOTOGRAPHING MODE

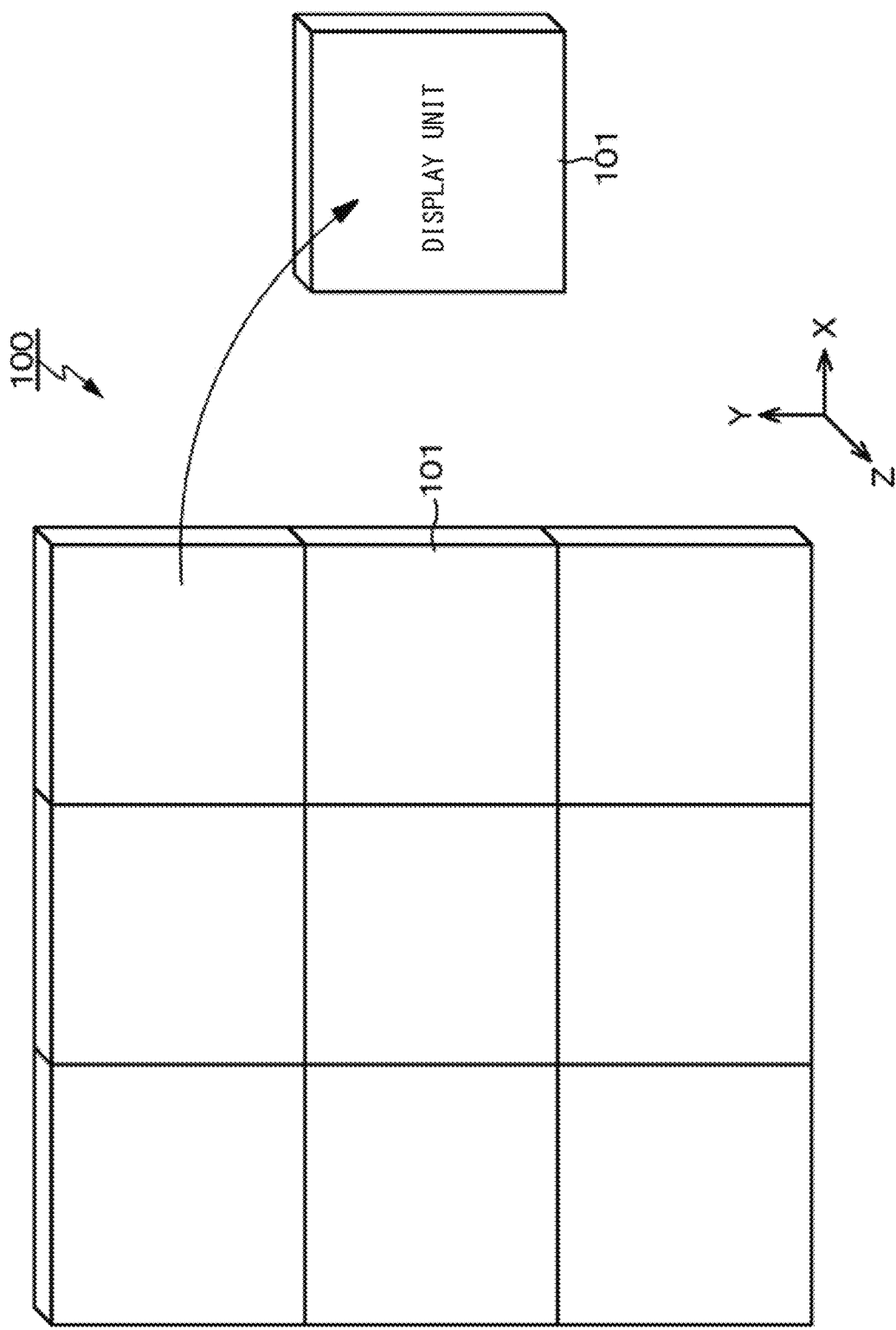

DISPLAY DEVICE, METHOD OF DRIVING DISPLAY DEVICE, AND ELECTRONIC APPARATUS

CROSS REFERENCE TO RELATED APPLICATIONS

This application is a national stage application under 35 U.S.C. 371 and claims the benefit of PCT Application No. PCT/JP2020/015666 having an international filing date of 7 Apr. 2020, which designated the United States, which PCT application claimed the benefit of Japanese Patent Application No. 2019-087519 filed 7 May 2019, the entire disclosures of each of which are incorporated herein by reference.

TECHNICAL FIELD

The present disclosure relates to a display device, a method of driving a display device, and an electronic apparatus.

BACKGROUND ART

As a light-emitting element (specifically, a self-emitting element) of a display device, it is possible to exemplify a light-emitting diode (LED), an organic EL (electroluminescence) element, and the like. Of these self-emitting elements, the light-emitting diode has attracted attention as a light-emitting element for a next-generation display because of less degradation in the element, high efficiency, and the like.

Incidentally, it is known that the light-emitting diode has a characteristic in which a spectrum is shifted to blue side by a current (a light emission current) flowing through the element, thereby causing fluctuations in chromaticity by the value of the light emission current, and large luminance variation in a low current range. Therefore, a current modulation scheme in which a current value flowing through an element is controlled was considered unsuitable for driving the light-emitting diode.

As driving without changing the current value flowing through the light-emitting element, PWM (Pulse Width Modulation) driving and sub-field driving are known. In the PWM driving, modulation is performed by changing a duty ratio of a light emitting section, and in the sub-field driving, one field is divided into a plurality of sub-fields to perform dividing. PTL 1 (Japanese Unexamined Patent Application Publication No. 2007-333768) discloses a technology using the PWM driving and a technology using the sub-field driving for driving the light-emitting element.

CITATION LIST

Patent Literature

PTL 1: Japanese Unexamined Patent Application Publication No. 2007-333768

SUMMARY OF THE INVENTION

Problems to be Solved by the Invention

Incidentally, high-resolution PWM driving is susceptible to noise and various types of fluctuations, and a circuit configuration having a large circuit scale is necessary to implement the high-resolution PWM driving. Specifically, in PWM driving by a method of obtaining a light emission duty by comparing a sawtooth wave signal and an image signal with a comparator, it is necessary to use a differential amplifier or the like to cope with noise and threshold fluctuations in a transistor. In addition, in PWM driving by a counter method, many digital circuits are necessary to achieve multiple gray scales.

Using a passive matrix method makes it possible to solve the above-described issues of the PWM driving; however, the passive matrix method has issues such as insufficient luminance caused by not taking a large light emission duty, and an increase in the number of drivers with higher definition, resulting in an increase in cost.

Meanwhile, the sub-field driving does not need a large circuit scale as compared with the PWM driving. However, in the sub-field driving, a gamma characteristic becomes linear, resulting in issues such as insufficient resolution of low gray scales in particular. Further, the sub-field driving has an issue in a pseudo contour of a moving image resulting from light emission in a sub-field.

Therefore, the present disclosure aims to provide a display device that is resistant to noise, various types of fluctuations, and the like with a simple circuit configuration, and has high gray-scale performance and no chromaticity change without using as much as possible a low current range that has many issues specifically in driving a light-emitting diode, a method of driving a display device, and an electronic apparatus including the display device.

Means for Solving the Problems

A display device according to the present disclosure to achieve the above-described object is provided with a pixel circuit. The pixel circuit includes:
a light-emitting element;
a current modulator that controls a current value flowing through the light-emitting element;
a current breaker that interrupts a current flowing through the light-emitting element; and
a gray-scale controller that controls the current modulator and the current breaker to perform gray-scale control.
the gray-scale controller discretely controls a light emission duty of the light-emitting element through the current breaker, and controls, through the current modulator, the current value flowing through the light-emitting element in accordance with the light emission duty of the light-emitting element.

In addition, a method of driving a display device according to the present disclosure to achieve the above-described object, the display device provided with a pixel circuit, the pixel circuit including
a light-emitting element,
a current modulator that controls a current value flowing through the light-emitting element, and
a current breaker that interrupts a current flowing through the light-emitting element,
the method of driving the display device includes:
discretely controlling a light emission duty of the light-emitting element by the current breaker, and controlling the current value flowing through the light-emitting element in accordance with the light emission duty of the light-emitting element by the current modulator, thereby performing gray-scale control.

In addition, an electronic apparatus according to the present disclosure to achieve the above-described object has a configuration including a display device having the above-described configuration.

BRIEF DESCRIPTION OF THE DRAWINGS

FIG. 5 is a characteristic diagram illustrating a current-luminance curve characteristic associated with discrete control of the light emission duty.

FIG. 17 is a schematic view of a tiling display according to a specific example of an electronic apparatus of the present disclosure.

MODES FOR CARRYING OUT THE INVENTION

Figure 1:
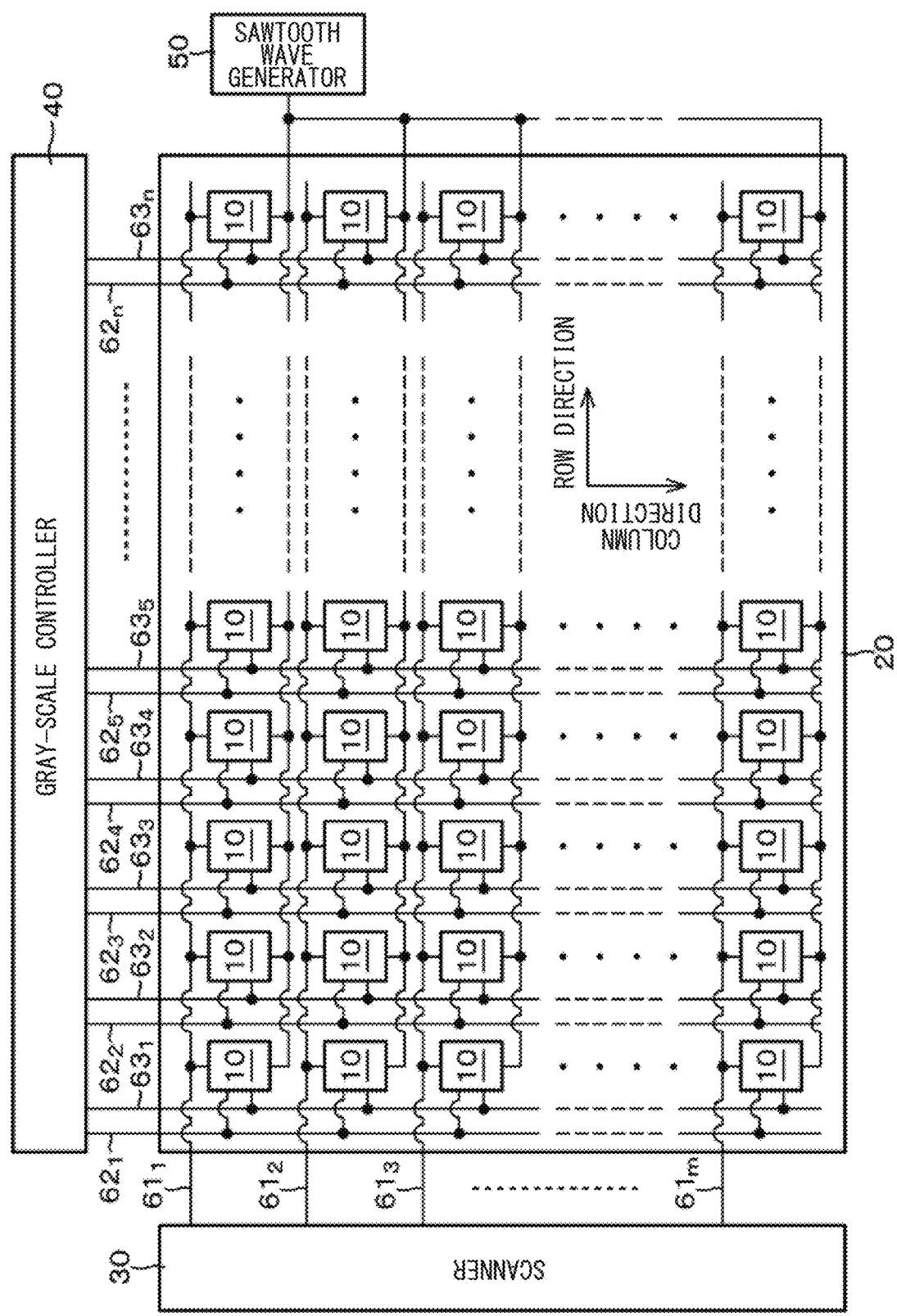
FIG. 1 is a conceptual diagram of a circuit included in a display device according to an embodiment of the present disclosure.

Hereinafter, modes for carrying out the technology of the present disclosure (hereinafter referred to as "embodiments") are described in detail with reference to the drawings. In the following description, the same components, or components having the same function are denoted by the same reference signs, and redundant description is omitted. It is to be noted that description is given in the following order.

1. Overall Description of Display Device, Method of Driving Display Device, and Electronic Apparatus
2. Display Device of Present Disclosure
2-1. Example 1 (A circuit example of a pixel circuit)
2-2. Example 2 (An example of a driving method in which gray-scale control is performed with use of the pixel circuit according to Example 1)
2-3. Example 3 (An example of a driving method in which chromaticity correction is performed in a current range used for gray-scale control)
2-4. Example 4 (A specific circuit example of the pixel circuit according to Example 1)
2-5. Example 5 (An example having a rephotographing mode)
2-6. Example 6 (A specific circuit example of the pixel circuit according to Example 1)
3. Modification Example
4. Electronic Apparatus of Present Disclosure (An example of a tiling display)
5. Configuration Achievable by Employing Present Disclosure <Overall Description of Display Device, Method of Driving Display Device, and Electronic Apparatus>

In a display device, a method of driving a display device, and an electronic apparatus of the present disclosure, it is possible for a gray-scale controller to have a configuration of discretely decreasing a light emission duty of a light-emitting element at a constant rate and controlling a current value flowing through the light-emitting element accordingly. Further, it is possible for the gray-scale controller to have a configuration of controlling the light emission duty of the light-emitting element and the current value flowing through the light-emitting element to approximate a current-luminance characteristic to a gamma characteristic with a logarithmic curve.

In the display device, the method of driving the display device, and the electronic apparatus of the present disclosure having the above-described preferable configuration, it is possible for the gray-scale controller to have a configuration using only a specific current range of the light-emitting element other than a minimum light emission width of the light-emitting element. Further, it is possible for the gray-scale controller to have a configuration of performing chromaticity correction in a single color in a section of a specific current range of the light-emitting element. Further, it is possible for the gray-scale controller to have a configuration of performing the chromaticity correction in the single color with use of a technology of interpolation processing, preferably performing the chromaticity correction in the single color by interpolation processing on current values at two or more points.

In addition, in the display device, the method of driving the display device, and the electronic apparatus of the present disclosure having the above-described preferable configuration, it is possible for a current breaker to have a configuration including a switch element that is coupled in series to the light-emitting element and a current modulator, and a duty controller that performs on/off control of the switch element. Then, it is possible for the duty controller to have a configuration of controlling a light emission duty of the switch element on the basis of a duty control signal supplied from the gray-scale controller and a stepwise sawtooth wave signal.

In addition, in the display device, the method of driving the display device, and the electronic apparatus of the present disclosure having the above-described preferable configuration, it is possible for the gray-scale controller to have a configuration of setting a change ratio of the light emission duty in one light emission in a light emission period in one frame when discretely controlling the light emission duty of the light-emitting element to a predetermined ratio or less.

In addition, in the display device, the method of driving the display device, and the electronic apparatus of the present disclosure having the above-described preferable configuration, it is possible to have a configuration having a rephotographing mode in which light emission in one frame period is divided into a plurality of times and a light emission duty is not periodically changed.

In addition, in the display device, the method of driving the display device, and the electronic apparatus of the present disclosure having the above-described preferable configuration, it is possible for the light-emitting element to include a light-emitting diode. It is possible for the light-emitting diode to include a light-emitting diode having a known configuration and a known structure. That is, a light-emitting diode having an optimum configuration and an optimum structure and including an appropriate material may be selected depending on an emitted light color of the light-emitting diode.

In the display device using the light-emitting diode as the light-emitting element, a light-emitting section including a red light-emitting diode serves as a red light-emitting sub-pixel (sub-pixel), a light-emitting section including a green light-emitting diode serves as a green light-emitting sub-pixel, and a light-emitting section including a blue light-emitting diode serves as a blue light-emitting sub-pixel. Then, these three types of sub-pixels are included in one pixel that is a unit that forms a color image. That is, it is possible to display a color image by light emission states of these three types of sub-pixels. It is to be noted that "one pixel" in the present disclosure corresponds to "one sub-pixel" in such a display device, and "one sub-pixel" in such a display device may be replaced with "one pixel".

<Display Device According to Embodiment of Present Disclosure>

FIG. 1 is a conceptual diagram of a circuit included in a display device according to an embodiment of the present disclosure. The display device according to the present embodiment includes a pixel array section 20 in which a plurality of pixel circuits 10 arranged in a matrix (a two-dimensional matrix) in a row direction and a column direction. The plurality of pixel circuits each includes a light-emitting element (a light-emitting section), and each is included in a pixel (more specifically, a sub-pixel, the same applies hereinafter).

The display device according to the present embodiment further includes, for example, a scanner (a scanning line driving section) 30, a gray-scale controller 40, a sawtooth wave generator 50, and the like as a peripheral driving section that is disposed around the pixel array section 20 and is provided for driving the plurality of pixel circuits 10.

The scanner 30 drives the plurality of pixel circuits 10 through scanning lines $61_1$ to $61_m$ wired to respective pixel rows of a m-row by n-column arrangement of pixels arranged in a two-dimensional matrix.

The gray-scale controller 40 supplies a current modulation signal I-Sig and a duty (Duty) control signal D-Sig to the plurality of pixel circuits 10 through two of control lines $62_1$ to $62_m$ and control lines $63_1$ to $63_m$ wired to respective pixel columns of the m-row by n-column arrangement of the pixels, and performs gray-scale control for each of the pixels.

The sawtooth wave generator 50 generates a sawtooth wave signal, e.g., a stepwise sawtooth wave signal SAW, and supplies the sawtooth wave signal SAW to each of the pixel circuits 10 of the pixel array section 20.

A portion or the entirety of the peripheral driving section including the scanner (scanning line driving section) 30, the gray-scale controller 40, the sawtooth wave generator 50, and the like may be provided on the same substrate as the pixel array section 20, or may be provided outside the substrate.

Specific examples of the circuit included in the display device according to the embodiment of the present disclosure are described below.

Example 1

Figure 2:
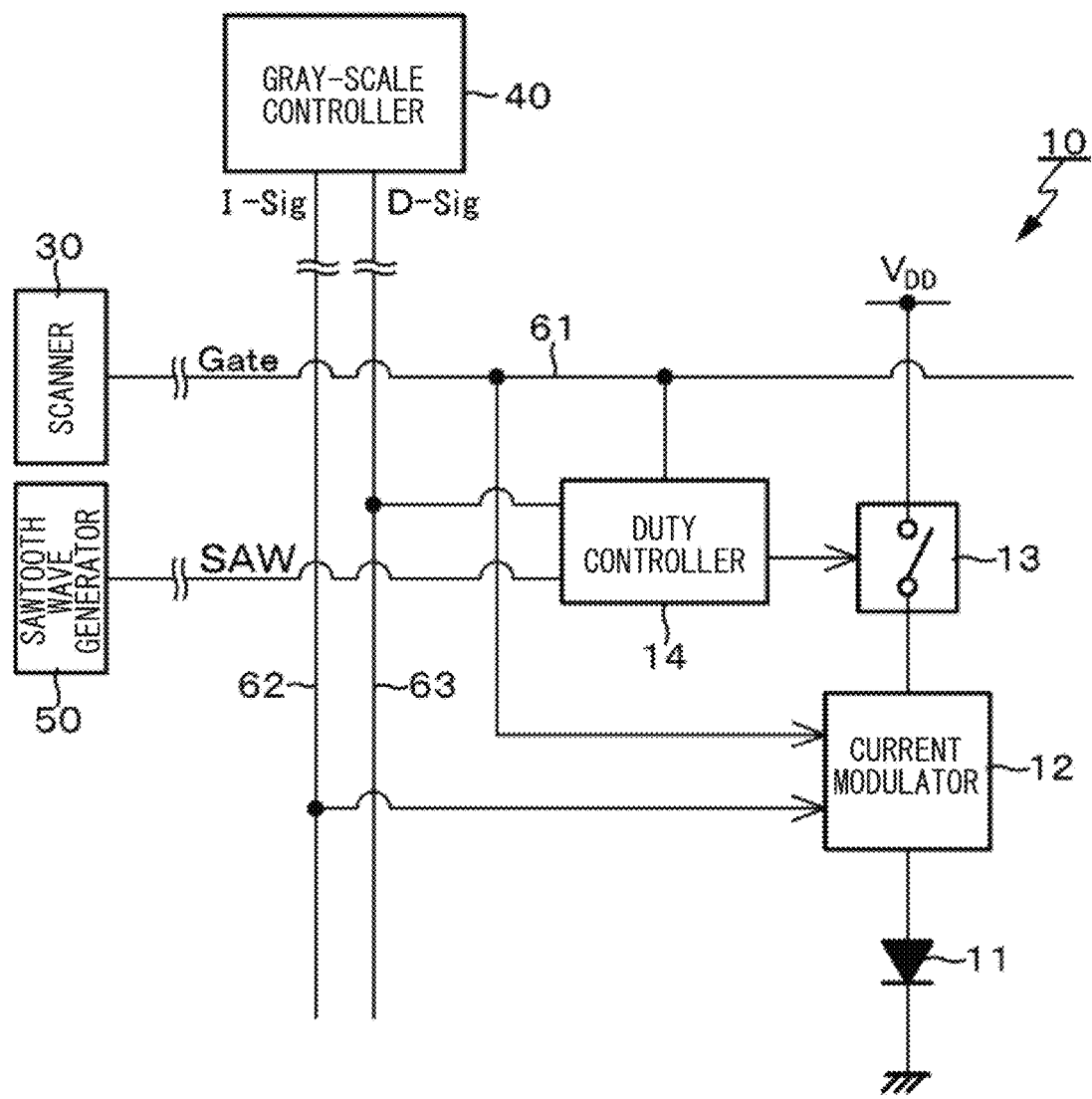
FIG. 2 is circuit diagram illustrating a circuit example of a pixel circuit according to Example 1.

Example 1 is a circuit example of the pixel circuit 10 according to Example 1. FIG. 2 illustrates a circuit diagram of the circuit example of the pixel circuit 10 according to Example 1.

The pixel circuit 10 has a configuration including a light-emitting element 11, a current modulator 12, a switch element 13, and a duty controller 14. It is possible to use a self-emitting element such as a light-emitting diode (LED) or an organic EL element as the light-emitting element 11.

In the pixel circuit 10 according to Example 1, a light-emitting diode (LED) is used as the light-emitting element 11. It is to be noted that it is known that in the light-emitting diode, a spectrum exhibits a so-called blue shift in which the spectrum is shifted to blue side by a current (a light emission current) flowing through the element, thereby causing fluctuations in chromaticity by the value of the light emission current and large luminance variation in a low current range.

The current modulator 12 is coupled to an anode electrode of the light-emitting element 11 having a cathode electrode coupled to a reference potential node (e.g., a ground), and is turned to an operation state in response to a scanning signal Gate supplied from the scanner 30 through the scanning line 61 ($61_1$ to $61_m$). Then, the current modulator 12 controls a current value flowing through the light-emitting element 11, that is, a current value flowing through the light-emitting diode in response to the current modulation signal I-Sig supplied from the gray-scale controller 40 through the control line 62 ($62_1$ to $62_m$).

The switch element 13 is included together with the duty controller 14 in a current breaker that interrupts the current flowing through the light-emitting element 11, and is coupled in series to the light-emitting element 11 and the current modulator 12. Specifically, the switch element 13 is coupled between a power supply line of a power supply voltage $V_{DD}$ and the current modulator 12, and selectively interrupts the current flowing through the light-emitting element 11 under control by the duty controller 14.

Figure 3:
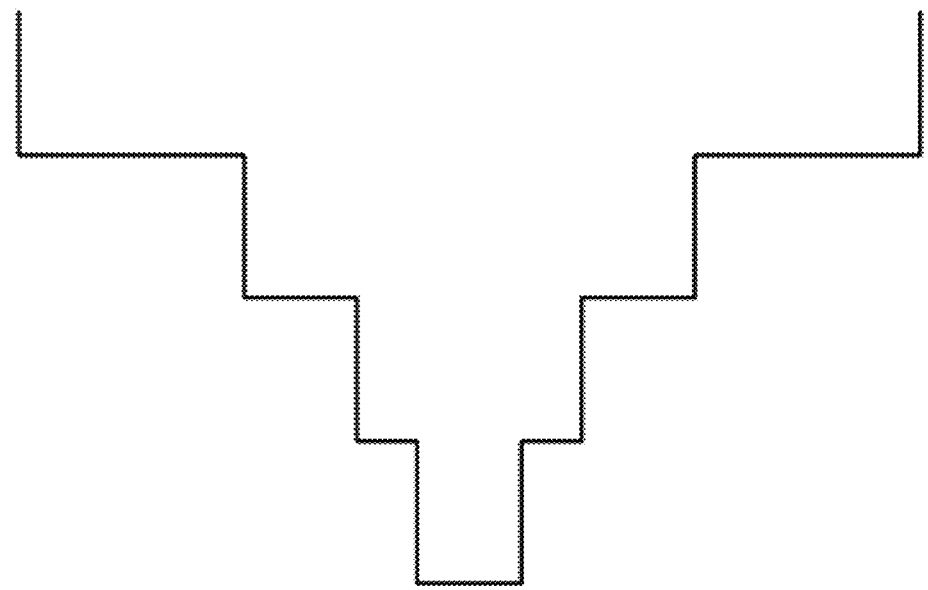
FIG. 3 is a waveform diagram illustrating a stepwise sawtooth wave signal SAW.
Figure 4A:
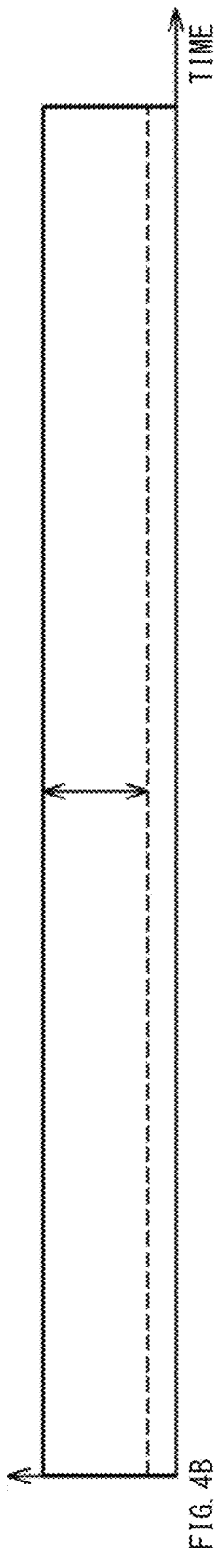
FIGS. 4A to 4D illustrate a state in which a light emission duty is discretely controlled by a driving method according to Example 1.
Figure 4B:
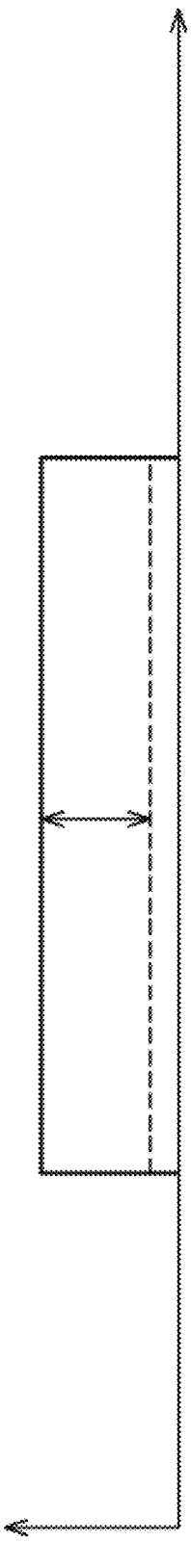
Figure 4C:
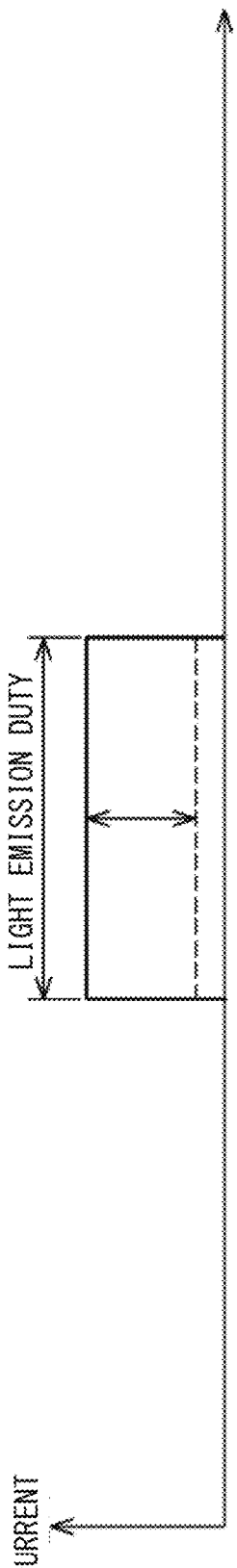
Figure 4D:
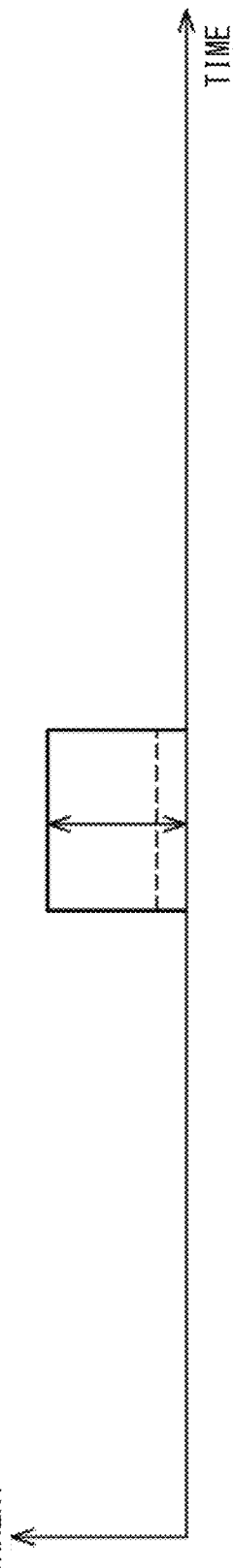

The duty controller 14 is supplied with the scanning signal Gate from the scanner 30 through the scanning line 61 ($61_1$ to $61_m$), is supplied with the duty control signal D-Sig from the gray-scale controller 40 through the control line 63 ($63_1$ to $63_m$), and is supplied with a waveform illustrated in FIG. 3, that is, the stepwise sawtooth wave signal SAW from the sawtooth wave generator 50. The duty controller 14 is turned to the operation state in response to the scanning signal Gate, thereby controlling a light emission duty of the light-emitting element 11 on the basis of the stepwise sawtooth wave signal SAW and the duty control signal D-Sig. Here, the "light emission duty" is a ratio of a light emission time in a period of one frame (one display frame) that is a display unit in which one image is displayed.

The gray-scale controller 40 performs gray-scale control (gray-scale expression) on the pixel circuit 10 having the above-described configuration by controlling the current modulator 12 and switch element 13 that is a current breaker. Specifically, the gray-scale controller 40 performs control to decrease the light emission duty of the light-emitting element 11 at a constant rate discretely (in a stepwise manner) by on/off control of the switch element 13 by the duty controller 14, and performs gray-scale expression by controlling the current value flowing through the light-emitting element 11 by the current modulator 12 in accordance with the light emission duty.

As described above, the pixel circuit 10 according to Example 1 has a configuration in which the switch element 13 is provided in series to the light-emitting element 11 and the current modulator 12 that controls the current value of the light-emitting element 11 and the switch element 13 discretely determines the light emission duty for each pixel. According to the pixel circuit 10 according to Example 1 having this configuration, the light emission duty is changed roughly in a stepwise manner by the switch element 13, and current modulation is finely performed under control by the gray-scale controller 40 in accordance with the light emission duty determined by the switch element 13, thus making it possible to implement driving using only a current value within a specific range.

In a case where the light emission duty is discretely changeable in this manner, for example, the stepwise sawtooth wave signal SAW is used to set a step height of a stepwise waveform to larger than the level of noise, which makes it possible to perform highly accurate control of the light emission duty even with a simple circuit configuration. The noise herein is potential fluctuations and the like resulting from power fluctuations upon light emission by the light-emitting element 11, and the level of the noise differs depending on a circuit form of the pixel circuit 10. In addition, it is possible for the current modulator 12 combined with the switch element 13 and the duty controller 14 that control the light emission duty to also perform fine gray-scale control with a simple circuit configuration.

Example 2

Example 2 is an example of a driving method in which gray-scale control is performed with use of the pixel circuit 10 according to Example 1. The gray-scale control is performed in the pixel circuit 10 according to Example 1 under control by the gray-scale controller 40 by control of the current value of the light-emitting element 11 by the current modulator 12 and on/off control of the switch element 13 by the duty controller 14.

Gray-scale change is considered, for example, in a case where the pixel circuit 10 according to Example 1 is used to decrease luminance from a state of a maximum light emission current value at a maximum light emission duty.

First, the current value of light-emitting element 11 is decreased finely, and the current value is decreased until luminance reaches a certain ratio (proportion) to maximum luminance. Then, the light emission duty is decreased to the ratio at this time, and the current value of the light-emitting element 11 is returned to the maximum light emission current value, and the current value of the light-emitting element 11 is decreased finely again. Thus, gray scales are changed. Decreasing again the current value of the light-emitting element 11, and at a point of decreasing to luminance at the above-described ratio with respect to the maximum luminance at this light emission duty, decreasing again the light emission duty to the above-described ratio with respect to the previous light emission duty are repeated.

FIGS. 4A to 4D illustrate a state in which the light emission duty is discretely controlled as described above. Performing such discrete control of the light emission duty makes it possible to cause a current-luminance characteristic to have a curve characteristic illustrated in FIG. 5. In a characteristic diagram illustrated in FIG. 5, luminance ranges A to D respectively correspond to light emission duties in FIGS. 4A to 4D. The characteristic diagram illustrated in FIG. 5 illustrates a case of two bits and four steps. Here, luminance L ($I_0$) is determined by the following expression, where a maximum light emission current value is $I_{max}$ and a light emission current causing luminance to be multiplied by α times is $I_0$.

$$L(I_0)=\alpha \cdot L(I_{max})$$

In the pixel circuit 10 according to Example 1, using the driving method according to Example 2 makes it possible to express many luminance gray scales with use of only a certain limited current section X as illustrated in the characteristic diagram in FIG. 5. In other words, it is possible to express many luminance gray scales with use of only a specific light emission current range X other than a minimum light emission width of the light-emitting element 11. This makes it possible to reduce an influence of chromaticity change in the light-emitting element 11 by a light emission current. In addition, in a case where it is possible to decrease a minimum light emission duty to some extent, it is also possible to express gray scales therebelow by error diffusion that is one of dithering methods. This makes it possible to express all gray scales without using a low current range having large luminance variation.

Figure 6:
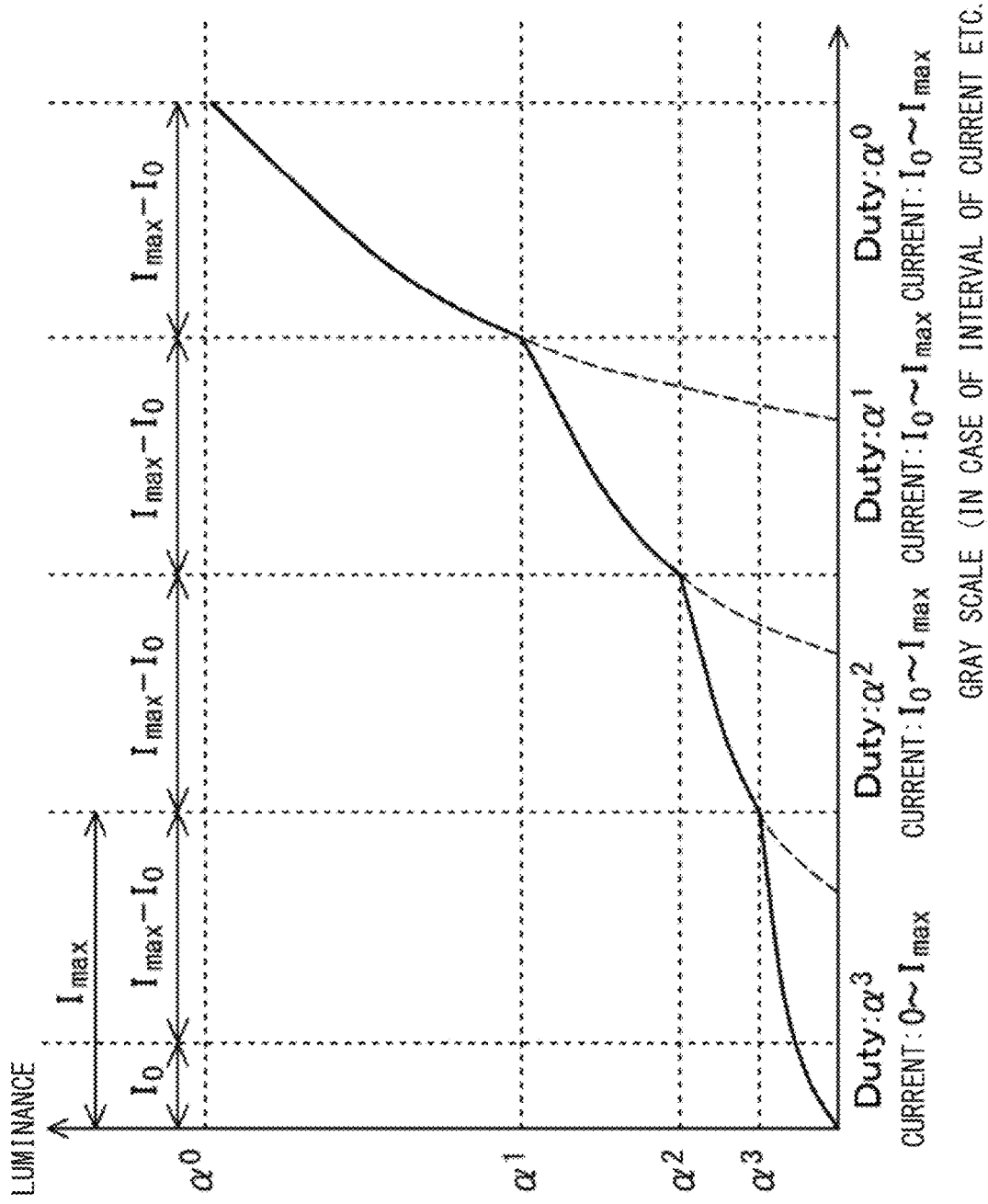
FIG. 6 is a current-luminance characteristic diagram drawn by connecting gray-scale changes illustrated in the characteristic diagram of FIG. 5.
Figure 7:
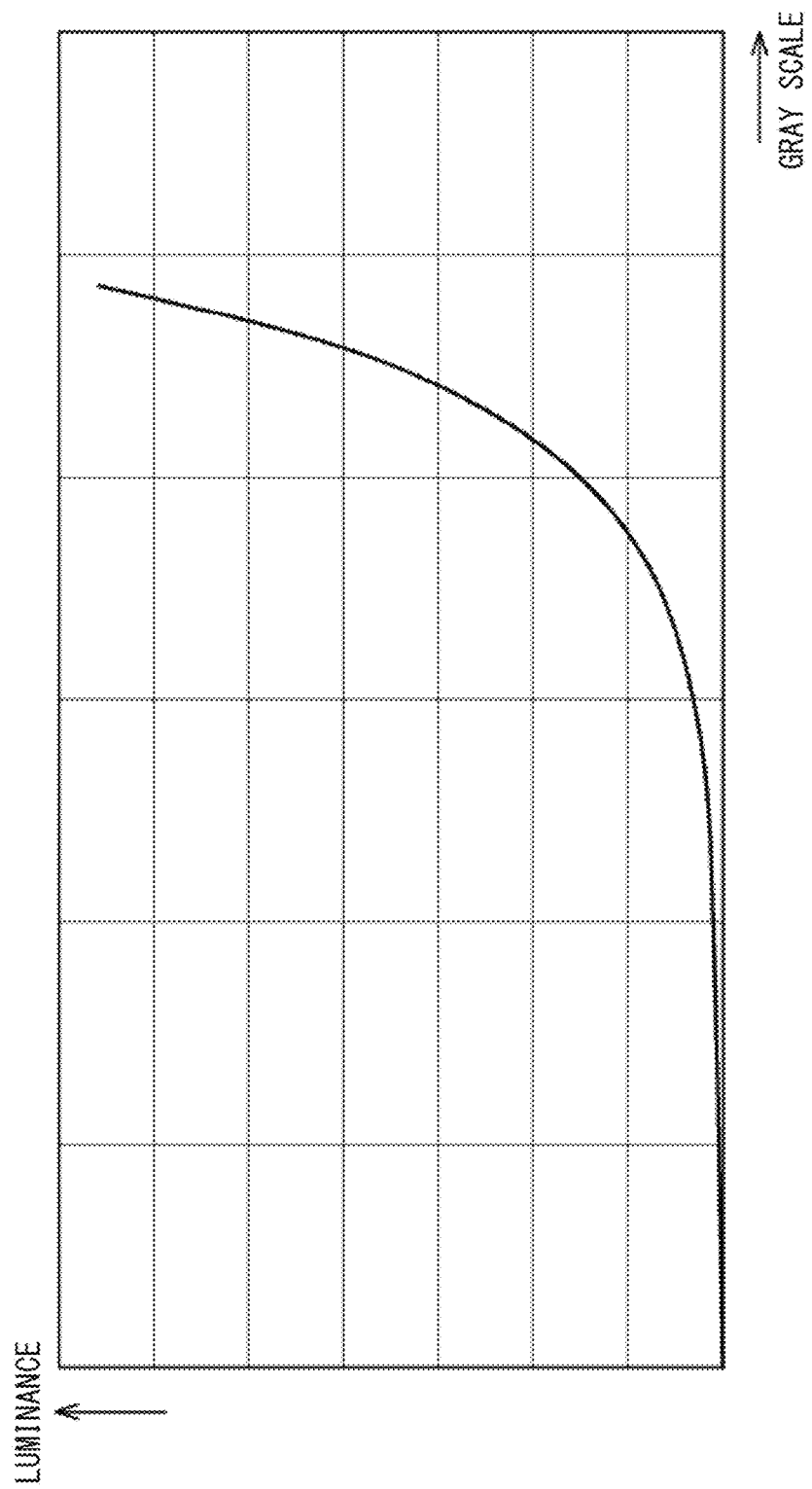
FIG. 7 is a characteristic diagram of a gamma characteristic in which current-luminance is a logarithmic curve.

A current-luminance characteristic diagram as illustrated in FIG. 6 is drawn by connecting gray-scale changes illustrated in the characteristic diagram of FIG. 5. Then, as the number of times of changing the light emission duty increases, the current-luminance characteristic is approximated to a gamma characteristic with a logarithmic curve as illustrated in a characteristic diagram in FIG. 7. In other words, the gray-scale controller 40 controls the light emission duty of the light-emitting element 11 and the current value flowing through the light-emitting element 11 to approximate the current-luminance characteristic to the gamma characteristic with the logarithmic curve.

The gamma characteristic with the logarithmic curve is an extremely advantageous characteristic for configuring a tiling display to be described later. The tiling display is a display device formed by arranging a plurality of display units (unit panels) in a tiled pattern. In the tiling display, in a case where adjacent display units do not have a similar gamma characteristic, a luminance difference occurs, resulting in degradation in image quality. Fine luminance adjustment is therefore necessary.

Accordingly, the tiling display uses, as the display unit, the above-described display device in which the current-luminance characteristic is the gamma characteristic with the logarithmic curve, which makes it possible to control luminance at a ratio with respect to the luminance over an entire range of the light emission current. Then, for example, if luminance is adjustable at a luminance ratio of about 1.8%, the luminance difference becomes equal to or less than a noticeable luminance difference of a human eye, which makes it possible to configure a tiling display having superior image quality without a luminance difference between adjacent display units.

Incidentally, in a case where a light-emitting diode is used as a light-emitting element of a display device using a backplane that has difficulty in using many elements such as TFT (Thin Film Transistor) circuits, luminance variation in a low current range, chromaticity change caused by the light emission current, and like are issues. In contrast, according to the driving method according to Example 2, it is possible to implement driving that is resistant to noise and various types of fluctuations even with a simple circuit configuration, and has high gray-scale performance and no chromaticity change without using as much as possible a low current range that has many issues in driving a light-emitting diode.

Example 3

Example 3 is an example of a driving method in which chromaticity correction is performed in a current range used for gray-scale control.

Figure 8:
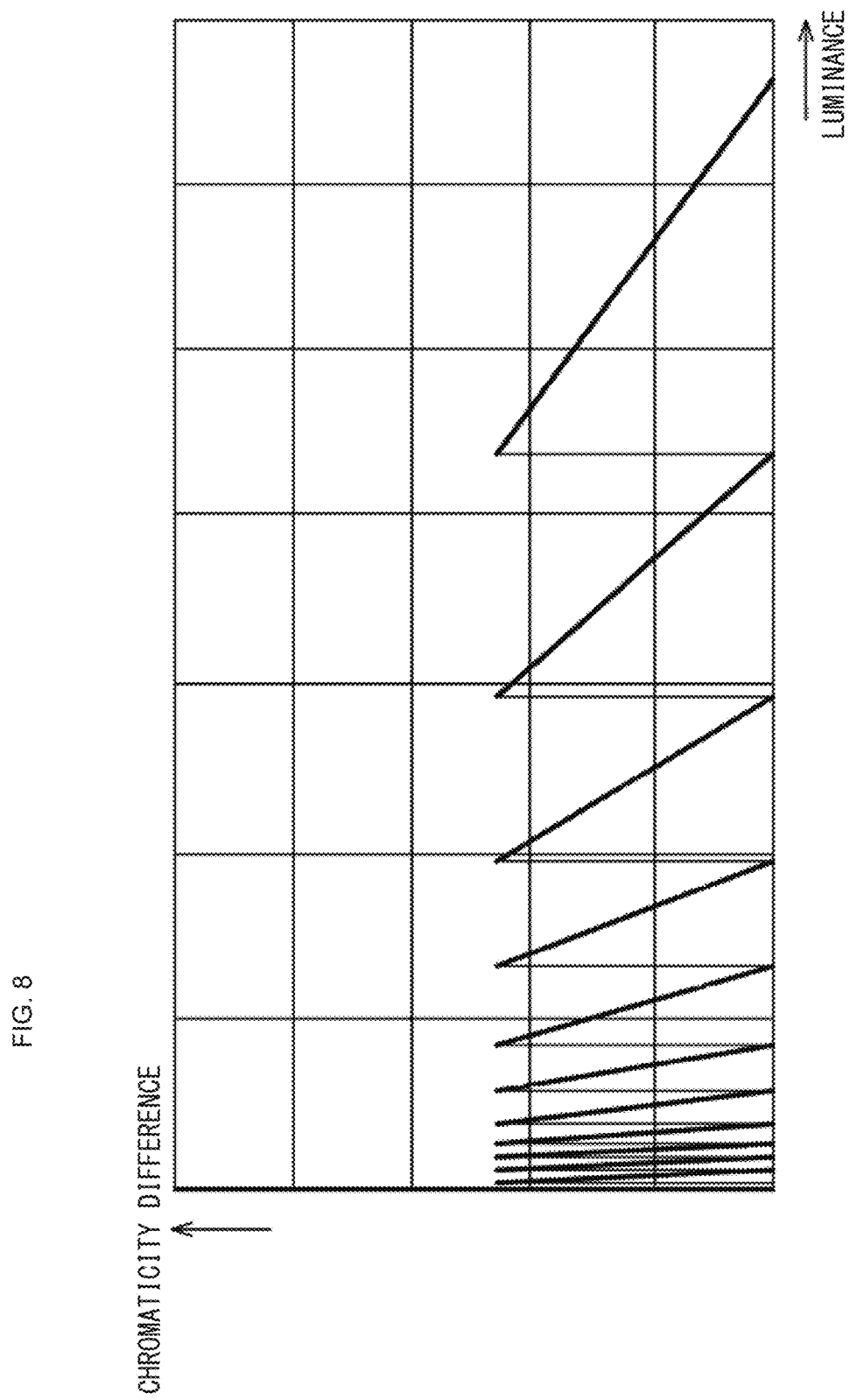
FIG. 8 is a luminance-chromaticity difference characteristic diagram in a case where chromaticity is not corrected by a driving method according to Example 3.

As described above, according to the driving method according to Example 2, it is possible to implement gray-scale control using only a limited current range (the current range X illustrated in FIG. 5). However, in the light-emitting element 11, specifically, the light-emitting diode, a spectrum exhibits a blue shift by the light emission current as described above, thereby causing chromaticity change by the current value of the light emission current. FIG. 8 illustrates a luminance-chromaticity difference characteristic diagram in a case where chromaticity is not corrected. In displaying or the like of an image of which colors change smoothly, chromaticity change by the light emission current may cause an issue such as banding (dark and light stripes).

In the driving method according to Example 3, chromaticity correction in a single color is performed under control by the gray-scale controller 40 in a section (the current range X illustrated in FIG. 5) of a specific current range used for gray-scale control. Although chromaticity correction may be performed at all points, it is considered that in a case where chromaticity correction is performed at all points, a correction circuit is complicated.

Figure 9:
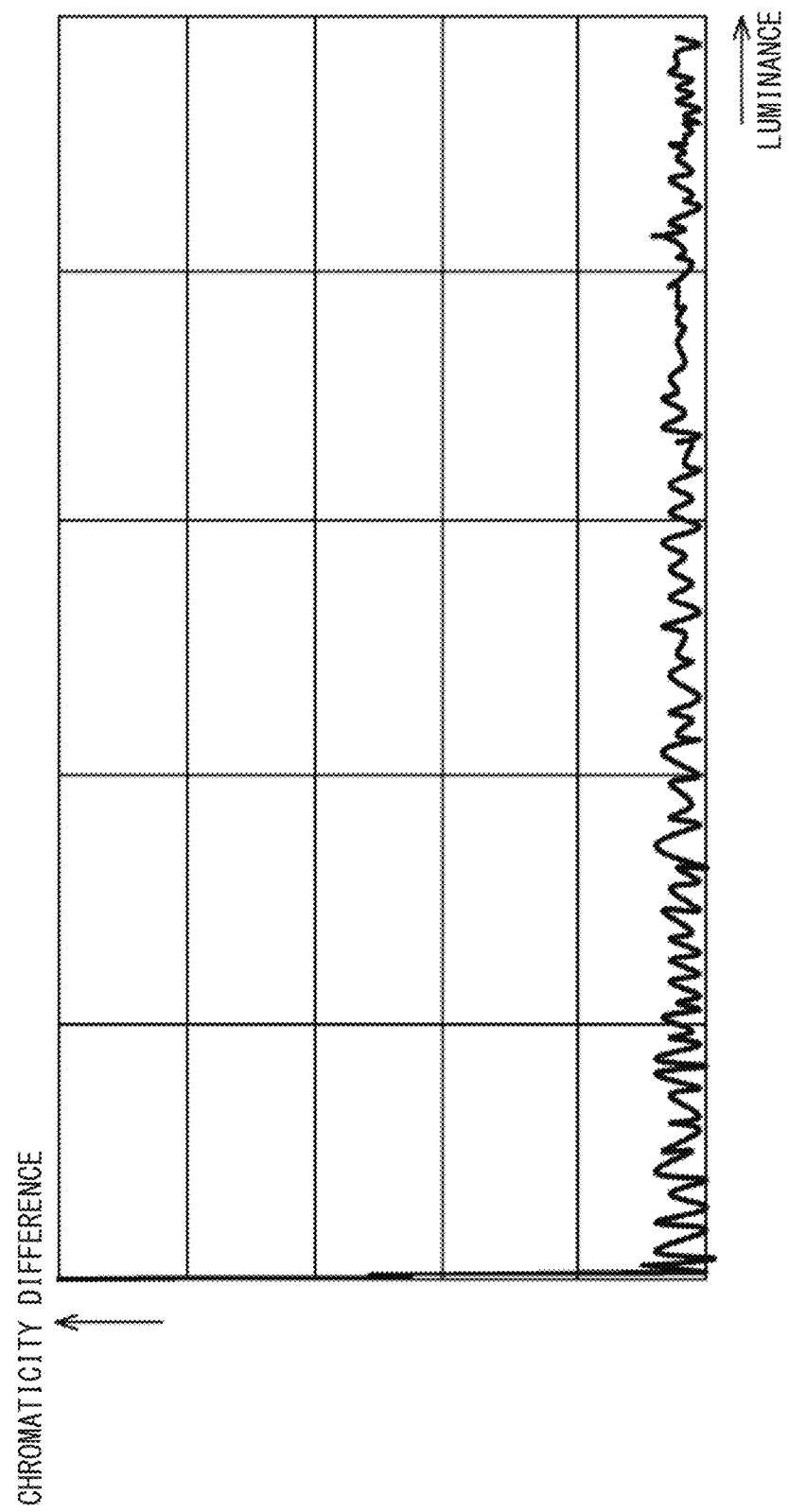
FIG. 9 is a luminance-chromaticity difference characteristic diagram of in a case where chromaticity is corrected by the driving method according to Example 3.

Accordingly, in the driving method according to Example 3, for example, chromaticity correction in a single color is performed at two points, that is, a lower end and an upper end in the current range X used for gray-scale control, and chromaticity correction in the current range X used for gray-scale control is performed by linearly interpolating current values at two or more points on the basis of two correction matrices. As described above, performing chromaticity correction in the single color at the lower end and the upper end of the current range X used for gray-scale control and further performing linear interpolation makes it possible to suppress chromaticity fluctuations as illustrated in a luminance-chromaticity difference characteristic diagram in FIG. 9.

Example 4

Example 4 is an example of a driving method in which chromaticity correction is performed in a current range used for gray-scale control.

Figure 10A:
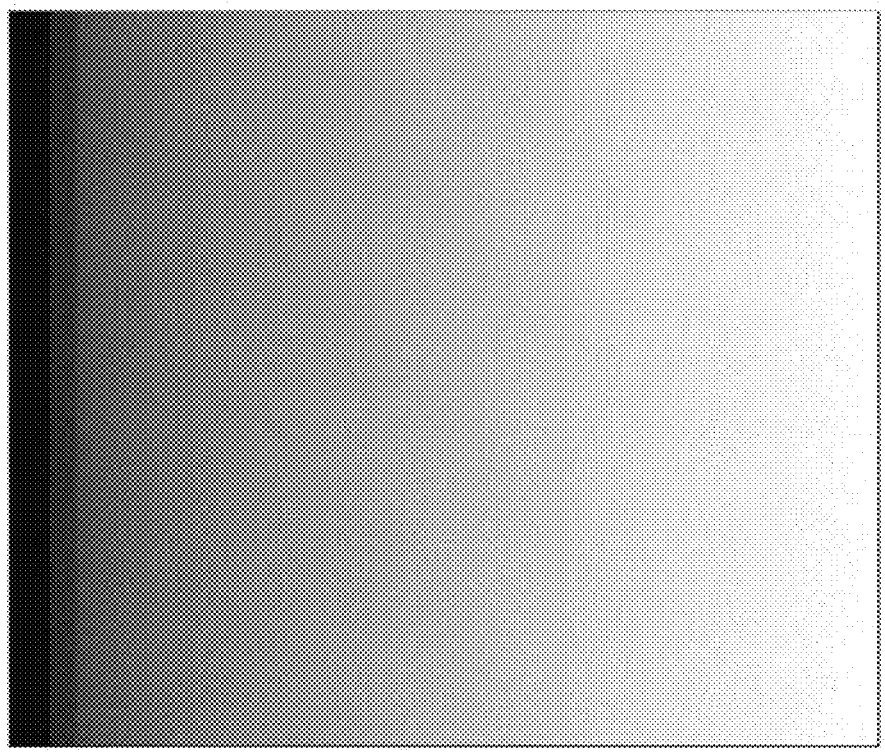
FIG. 10A illustrates an image in a scroll of a lamp image without discrete change in a light emission duty.
Figure 10B:
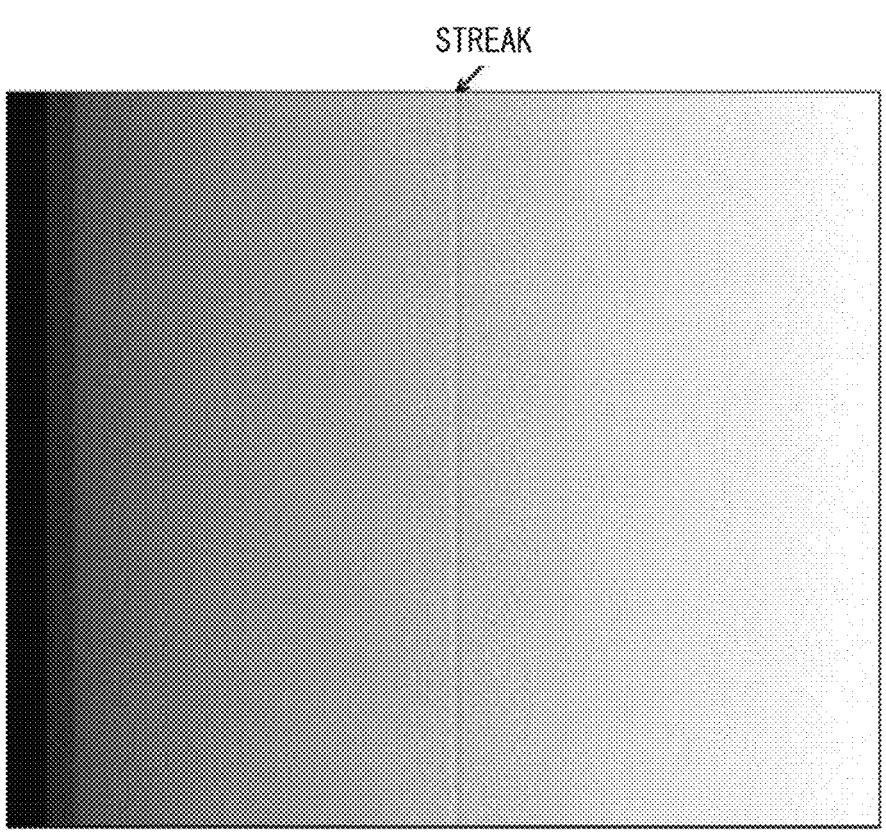
FIG. 10B illustrates an image in a scroll of a lamp image with discrete change in a light emission duty.
Figure 11A:
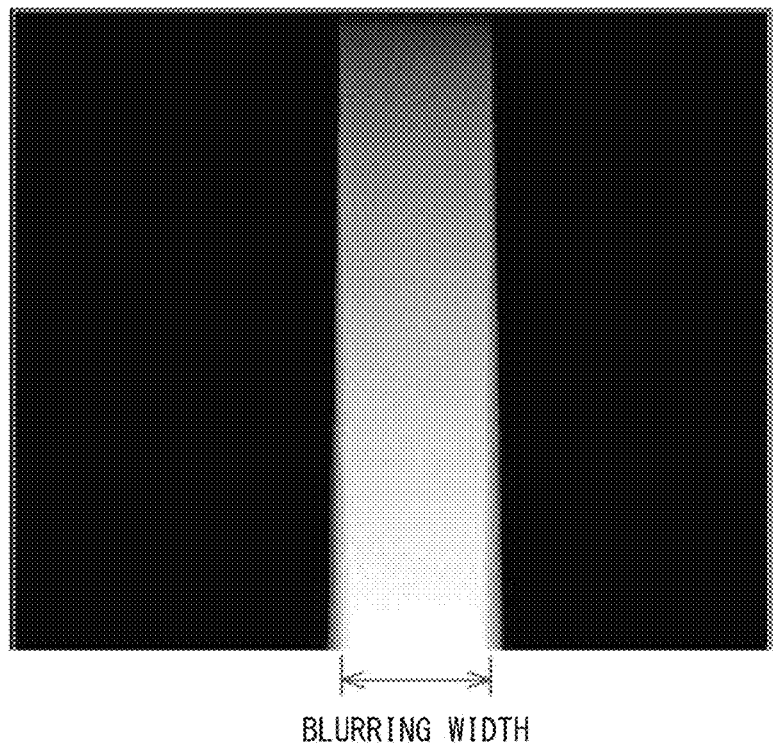
FIG. 11A illustrates an image in a scroll of a rectangular shape without discrete change in a light emission duty.
Figure 11B:
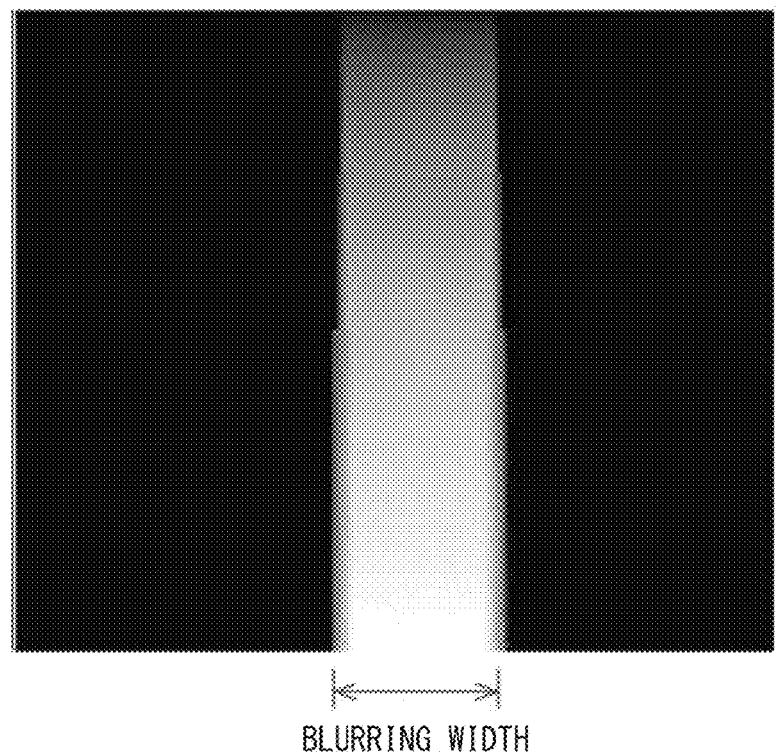
FIG. 11B illustrates an image in a scroll of a rectangular shape with discrete change in a light emission duty.

The driving method according to Example 3, in which chromaticity correction is performed in the section X of the specific current range, may involve extreme change in the light emission duty between certain gray scales. Generally, it is known that the light emission duty exerts a large influence on moving image blurring (moving image distortion). Therefore, in a case where an influence of discrete change in the light emission duty on a moving image is simulated, in a scroll of a lamp image having gradual gray-scale change as illustrated in FIG. 10A, a pseudo-contoured streak may be generated as illustrated in FIG. 10B. In addition, in a scroll of a rectangular shape having gradual luminance change as illustrated in FIG. 11A, an extreme difference in blurring width is recognized as illustrated in FIG. 11B.

Accordingly, in the driving method according to Example 4, while light emission is partially divided and a total light emission duty is maintained, a change ratio of the light emission duty in one light emission in a light emission period in one frame is set to a predetermined ratio or less, i.e., time change from the start of light emission to the end of the light emission is reduced not to involve extreme change in the light emission duty.

Figure 12A:
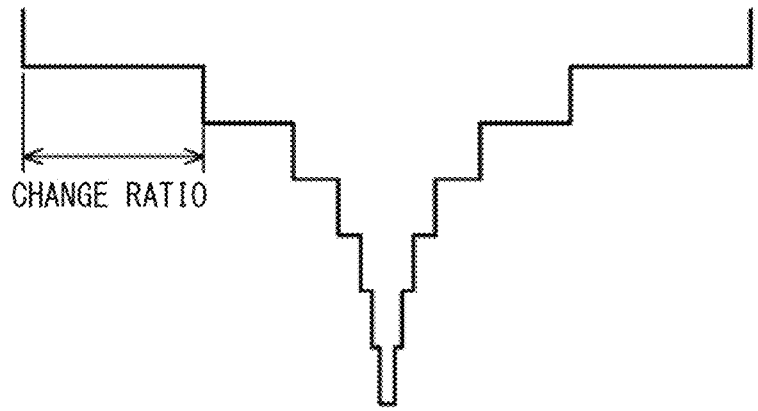
FIG. 12A is a waveform diagram of the sawtooth wave signal SAW with extreme change in a light emission duty between gray scales.
Figure 12B:
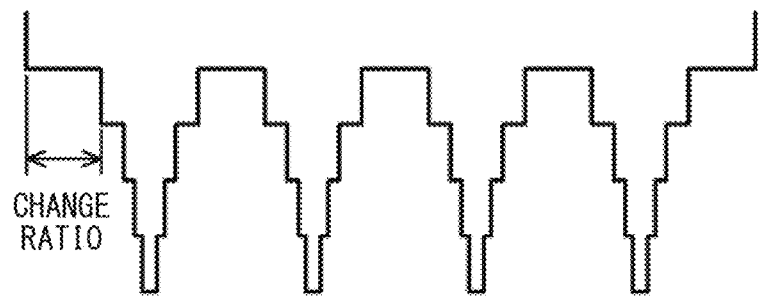
FIGS. 12B to 12D are waveform diagrams of the sawtooth wave signal SAW for achieving a driving method according to Example 4.
Figure 12C:
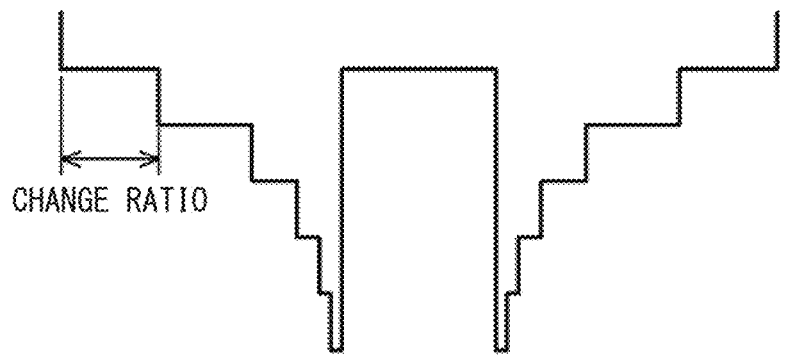
Figure 12D:
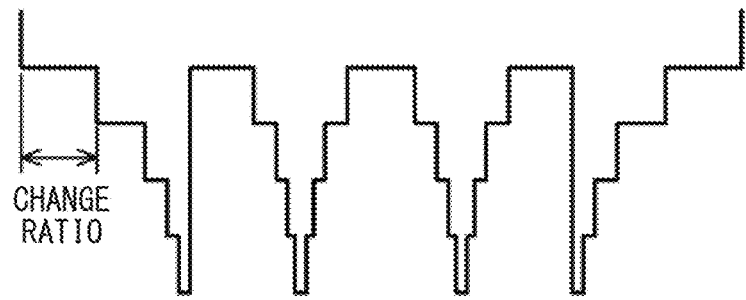

The waveform of the stepwise sawtooth wave signal SAW illustrated in FIG. 12A corresponds to the waveform of the stepwise sawtooth wave signal SAW illustrated in FIG. 3, and an example involving extreme change in the light emission duty between certain gray scales as illustrated in FIGS. 4A to 4D. In contrast, in the driving method according to Example 4, the stepwise sawtooth wave signal SAW having a waveform as illustrated in FIGS. 12B to 12D is used, which makes it possible to, while maintaining the total light emission duty, reduce time change from the start of light emission to the end of the light emission in a light emission period in one frame to smaller than that in a case illustrated in FIG. 12A that involves extreme change in the light emission duty between certain gray scales.

In the driving method according to Example 4, time change from the start of light emission to the end of the light emission in a light emission period in one frame is reduced and the light emission duty is narrowed, which means that black is inserted. Then, black insertion makes it possible to reduce an influence on moving image blurring (moving image distortion).

Example 5

Example 5 is an example having a rephotographing mode in which strong light emission is implemented for rephotographing. The "rephotographing" means, for example, photographing an image displayed on a large screen by an imaging device such as a CMOS camera.

Figure 13A:
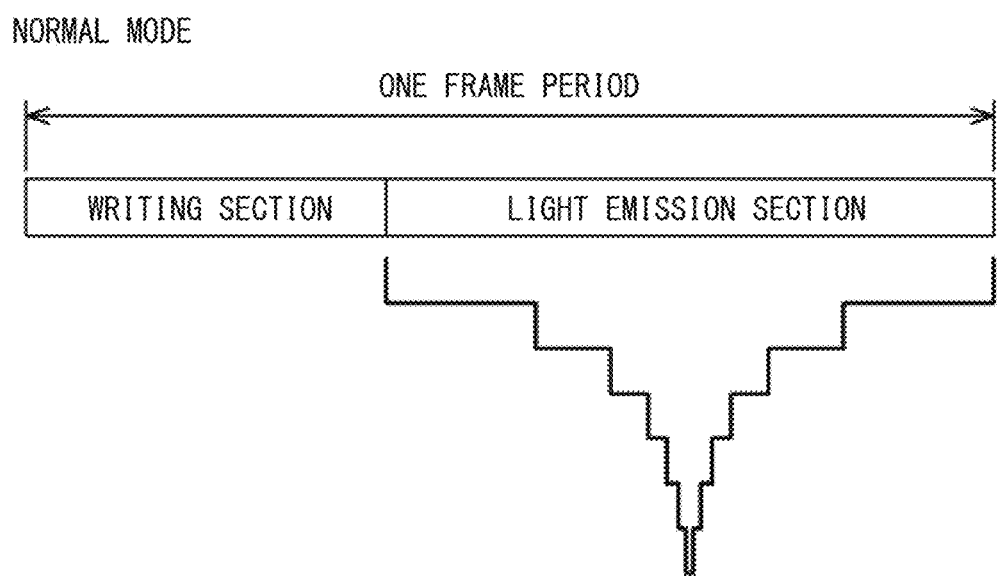
FIG. 13A is an explanatory diagram of an operation in a normal mode.
Figure 13B:
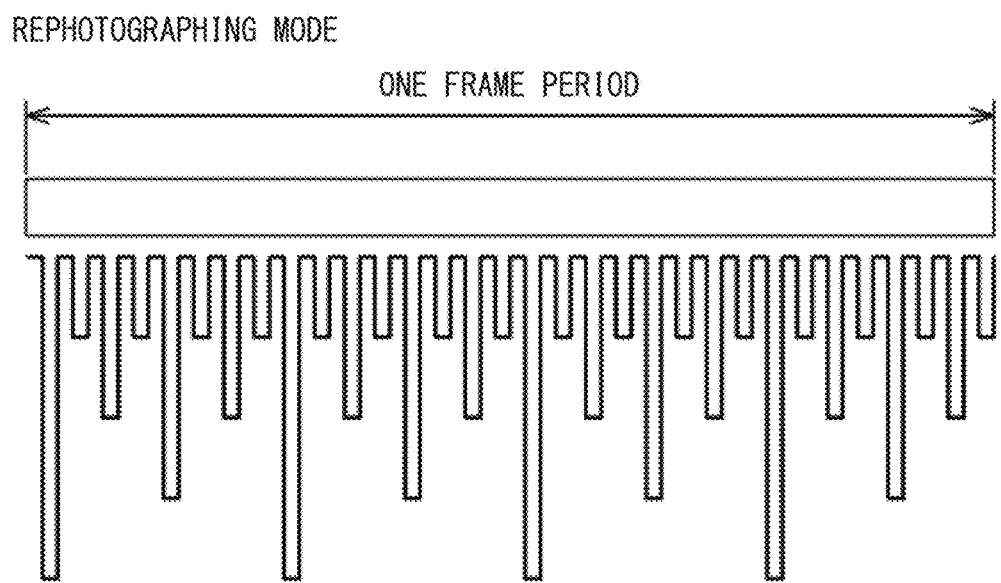
FIG. 13B is an explanatory diagram of an operation in a rephotographing mode.

A display device according to Example 5 has the rephotographing mode in which strong light emission is implemented for rephotographing, in addition to a normal mode in which control is performed to discretely change a light emission duty. As illustrated in FIG. 13A, in an operation in the normal mode, one frame period is divided into a writing section and a light emission section and the light emission duty in the light emission section is discretely changed. In contrast, as illustrated in FIG. 13B, in an operation in the rephotographing mode, light emission in one frame period is divided into a plurality of times and the light emission duty is not periodically changed.

In the normal mode, a section in which the light-emitting element 11 does not emit light is present, and black is displayed in the section, and in a case where rephotographing is performed, an image of black is captured as a black streak, resulting in degradation in the captured image. In contrast, according to the rephotographing mode according to Example 5, the light-emitting element 11 constantly emits light, which makes it possible to implement strong light emission for rephotographing and to suppress occurrence of a moving image issue described in Example 4.

Example 6

Figure 14:
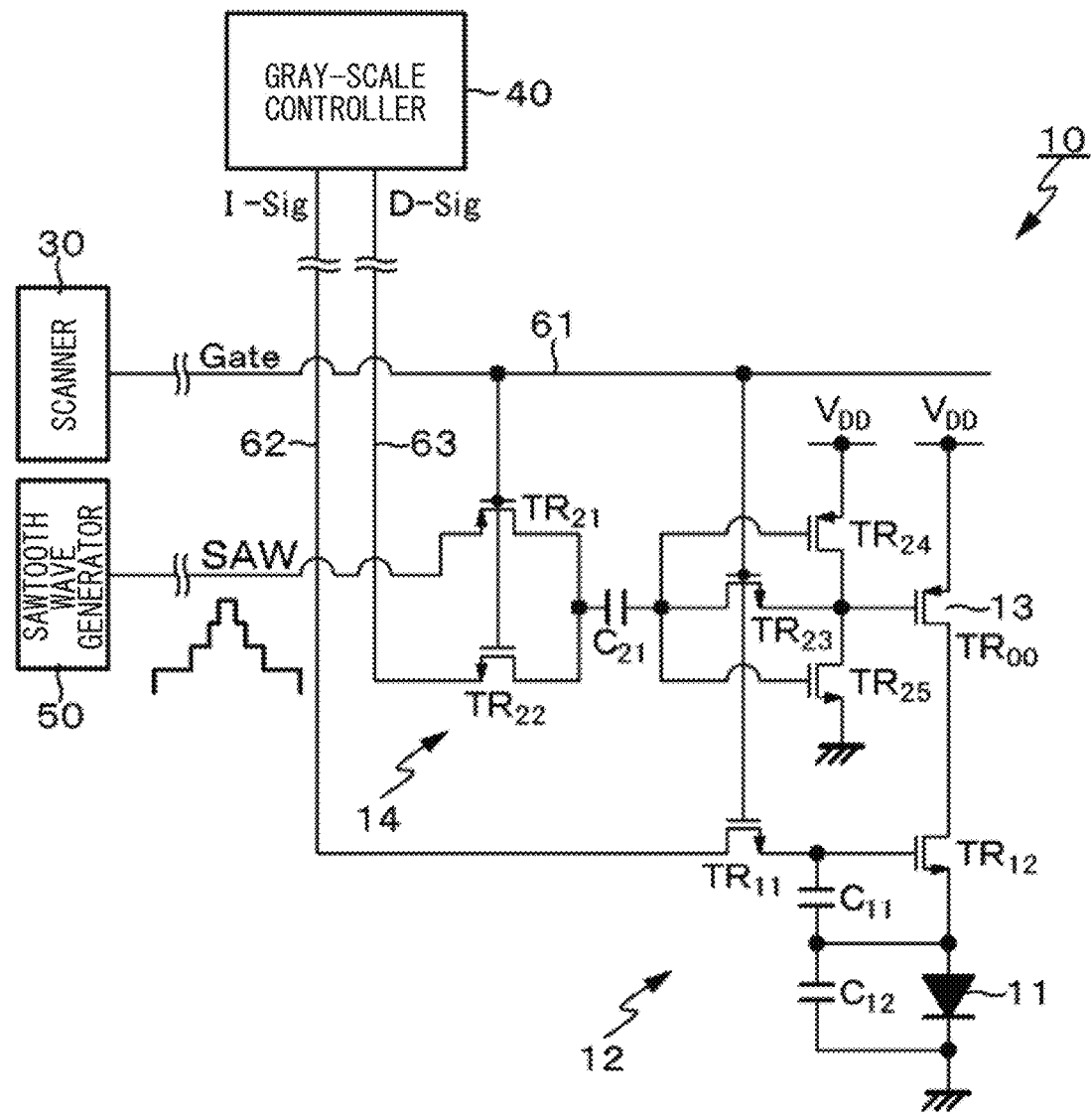
FIG. 14 is a circuit diagram illustrating a specific circuit example of a current modulator and a duty controller according to Example 1.

Example 6 is a specific circuit example of the pixel circuit 10 according to Example 1, specifically a specific circuit example of the current modulator 12 and the duty controller 14 in the pixel circuit 10 according to Example 1. FIG. 14 illustrates a circuit diagram of a specific circuit example of the current modulator 12 and the duty controller 14 according to Example 2. It is to be noted that in Example 6, a P-channel field effect transistor $TR_{00}$ is used as the switch element 13.

(Current Modulator)

The current modulator 12 includes a sampling transistor (writing transistor) $TR_{11}$, a driving transistor $TR_{12}$, and two capacitors $C_{11}$ and $C_{12}$.

The sampling transistor $TR_{11}$ includes an N-channel field effect transistor, and samples the current modulation signal I-Sig supplied from the gray-scale controller in response to the scanning signal Gate supplied from the scanner 30.

The capacitor $C_{11}$ is coupled between a gate electrode and a source electrode of the driving transistor $TR_{12}$, and holds a voltage corresponding to the current modulation signal I-Sig supplied through the sampling transistor $TR_{11}$. The capacitor $C_{12}$ is coupled in parallel to the light-emitting element 11.

The driving transistor $TR_{12}$ includes an N-channel field effect transistor coupled in series to the light-emitting element 11, and causes a current corresponding to the voltage held by the capacitor $C_{11}$ to flow through the light-emitting element 11, thereby driving the light-emitting element 11.

The current modulator 12 having the above-described configuration controls a current value flowing through the light-emitting element 11 in accordance with the current modulation signal I-Sig supplied from the gray-scale controller 40 under driving by the driving transistor $TR_{12}$.

(Duty Controller)

The duty controller 14 has a chopper comparator configuration including a P-channel field effect transistor $TR_{21}$ and N-channel field effect transistors $TR_{22}$ and $TR_{23}$ as three switch elements, one capacitor $C_{21}$, a P-channel field effect transistor $TR_{24}$, and an N-channel field effect transistor $TR_{25}$. The P-channel field effect transistor $TR_{24}$ and the N-channel field effect transistor $TR_{25}$ are included in a CMOS inverter.

Each of gate electrodes of the field effect transistor $TR_{21}$ and the field effect transistor $TR_{22}$ of opposite conductivity types is supplied with the scanning signal Gate from the scanner 30 through the scanning line 61 ($61_1$ to $61_m$). In addition, respective output nodes (drain electrodes) of the field effect transistor $TR_{21}$ and the field effect transistor $TR_{22}$ are coupled in common.

An input node (a source electrode) of the field effect transistor $TR_{21}$ is supplied with a waveform illustrated in FIGS. 4A to 4D, that is, the stepwise sawtooth wave signal SAW from the sawtooth wave generator 50. The field effect transistor $TR_{21}$ is turned to a conductive state in response to the scanning signal Gate, thereby selectively capturing the stepwise sawtooth wave signal SAW. An input end (a source electrode) of the field effect transistor $TR_{22}$ is supplied with the duty control signal D-Sig from the gray-scale controller 40. The field effect transistor $TR_{22}$ is turned to a conductive state in response to the scanning signal Gate, thereby selectively capturing the duty control signal D-Sig.

The capacitor $C_{21}$ has one end coupled to a drain common coupling node of the field effect transistor $TR_{21}$ and the field effect transistor $TR_{22}$. Another end of the capacitor $C_{21}$ is coupled to an input node of the CMOS inverter, that is, a gate common coupling node of the P-channel field effect transistor $TR_{24}$ and the N-channel field effect transistor $TR_{25}$.

The P-channel field effect transistor $TR_{24}$ and the N-channel field effect transistor $TR_{25}$ are coupled in series between the power supply line of the power supply voltage $V_{DD}$ and a reference potential node (e.g., a ground), and gate electrodes thereof are coupled in common to form the CMOS inverter.

The N-channel field effect transistor $TR_{23}$ is coupled between the input node (the gate common coupling node of the field effect transistor $TR_{24}$ and the N-channel field effect transistor $TR_{25}$) and an output node (the drain common coupling node of the field effect transistor $TR_{24}$ and the field effect transistor $TR_{25}$) of the CMOS inverter. In addition, a gate electrode of the field effect transistor $TR_{23}$ is coupled to the scanning line 61 ($61_1$ to $61_m$).

The output node (the drain common coupling node of the field effect transistor $TR_{24}$ and the field effect transistor $TR_{25}$) of the CMOS inverter is coupled to a gate electrode of the P-channel field effect transistor $TR_{00}$ as the switch element 13.

It is to be noted that the circuit example of the current modulator 12 and the duty controller 14 exemplified here is an example, and the circuit configurations of the current modulator 12 and the duty controller 14 are not limited to the above-described circuit example.

Modification Example

Although the technology of the present disclosure has been described on the basis of preferred embodiments, the technology of the present disclosure is not limited to the embodiments. The configuration and the structure of the display device described in the above-described embodiments are examples, and may be modified as appropriate. For example, in the pixel circuit according to Example 1, as a coupling relationship among the light-emitting element 11, the current modulator 12, and the switch element 13, a circuit configuration in which they are coupled in series in this order from ground side is exemplified, but the coupling relationship is not limited thereto.

Figure 15:
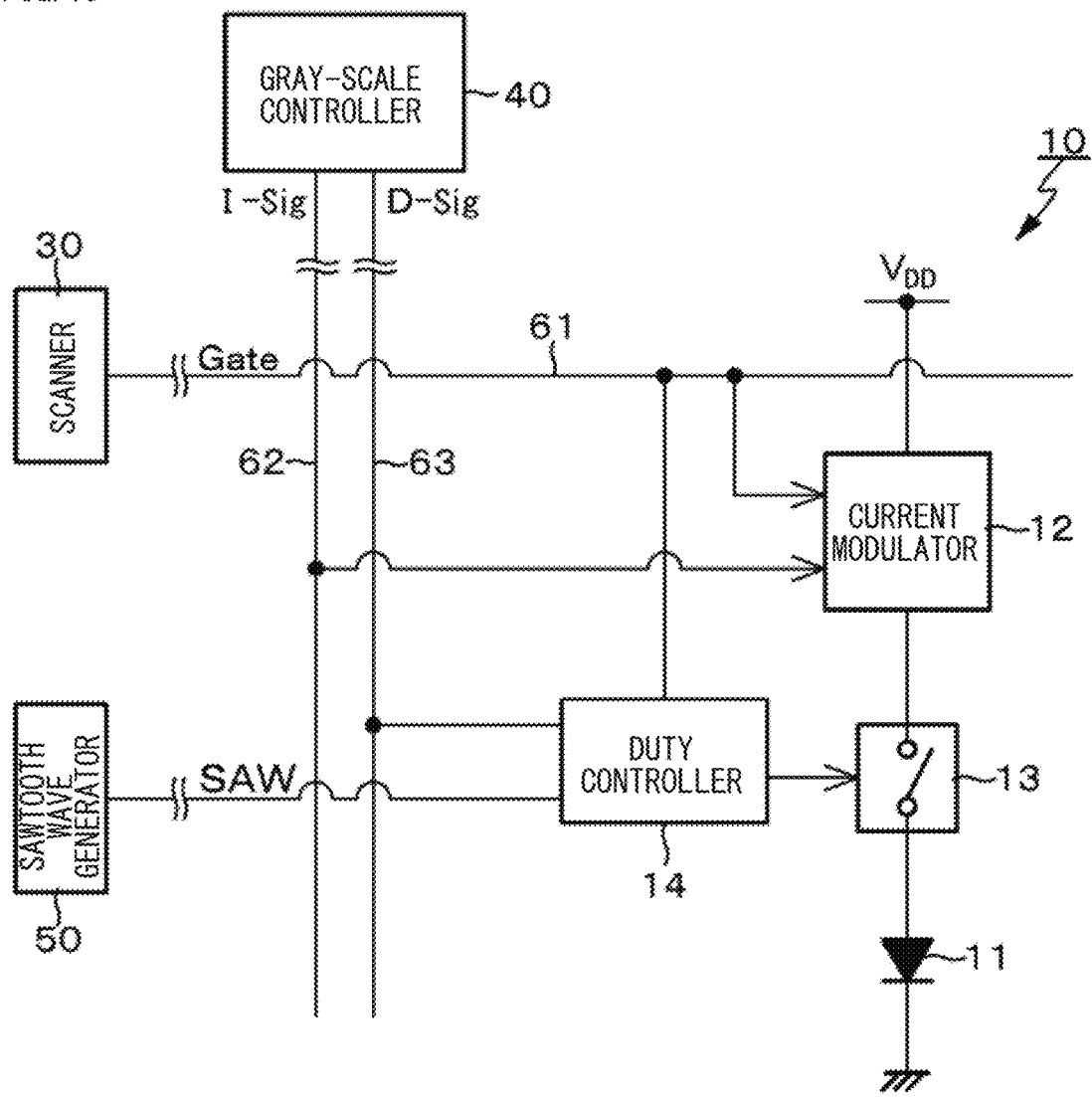
FIG. 15 is a circuit diagram illustrating a circuit example of a pixel circuit according to a modification example of Example 1.

That is, it is sufficient if the switch element 13 is coupled in series to the light-emitting element 11 and the current modulator 12. FIG. 15 illustrates a circuit diagram of a pixel circuit according to a modification example of Example 1. As with the pixel circuit according to the modification example, a coupling relationship may be adopted in which the light-emitting element 11, the switch element 13, and the current modulator 12 are disposed, between the ground and the power supply line of the power supply voltage $V_{DD}$, in this order from the ground side.

Figure 16A:
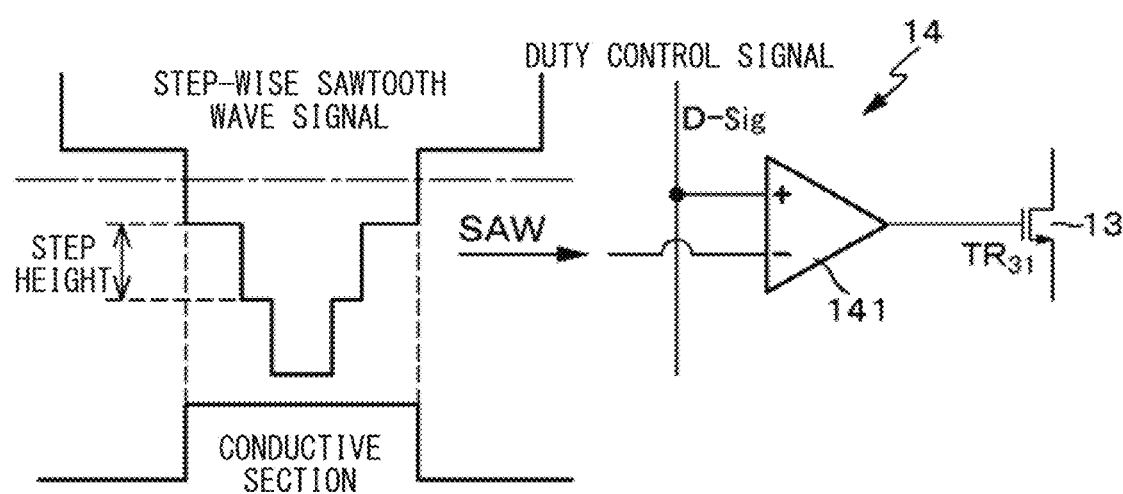
FIG. 16A and FIG. 16B are circuit diagrams illustrating a first circuit example and a second circuit example of the duty controller according to Example 1.
Figure 16B:
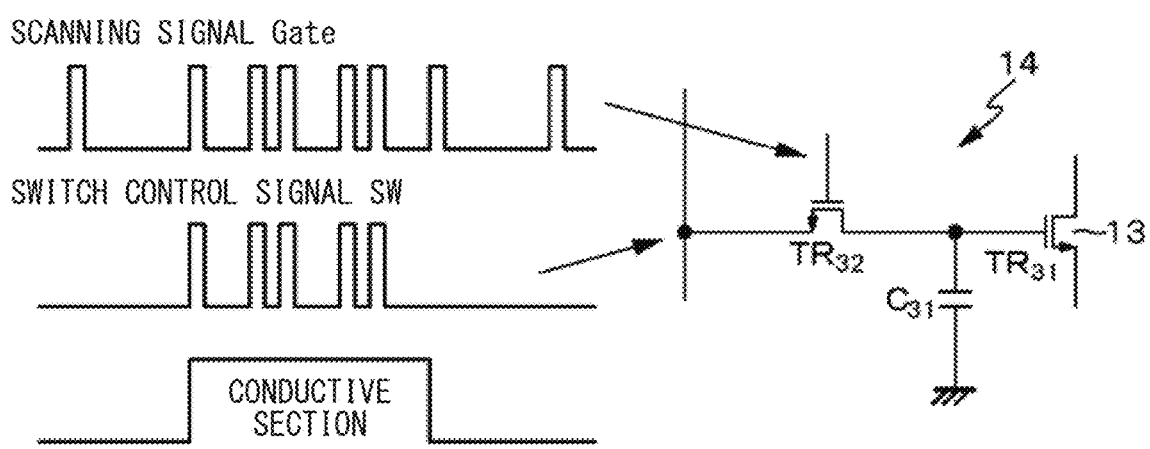

FIGS. 16A and 16B illustrate circuit diagrams of a first circuit example and a second circuit example of the duty controller 14 in the pixel circuit according to the modification example of Example 1. It is to be noted that in the first circuit example and the second circuit example, an N-channel field effect transistor $TR_{31}$ is used as the switch element 13.

First Circuit Example

The duty controller 14 according to the first circuit example has a configuration including a comparator 141.

The comparator 141 has the duty control signal D-Sig as a non-inverting (+) input and the stepwise sawtooth wave signal SAW as an inverting (−) input. Then, the comparator 141 performs comparison between the duty control signal D-Sig and the stepwise sawtooth wave signal SAW, and performs on/off driving of the switch element 13 including the N-channel field effect transistor $TR_{31}$ on the basis of a result of the comparison.

Second Circuit Example

The duty controller 14 according to the second circuit example has a circuit configuration including a writing transistor $TR_{32}$ that includes an N-channel field effect transistor, and a holding capacitor $C_{31}$. The writing transistor $TR_{32}$ is turned to the conductive state in response to the scanning signal Gate applied to a gate electrode, thereby writing the switch control signal SW on the holding capacitor $C_{31}$, and performing on/off driving of the switch element 13.

<Electronic Apparatus of Present Disclosure>

The display device of the present disclosure described above is applicable to a display section (a display device) of an electronic apparatus in any field that displays, as an image or a picture, an image signal inputted to the electronic apparatus or an image signal generated internally. Examples of the electronic apparatus of the present disclosure include a television set, a notebook personal computer, a digital still camera, a portable terminal device such as a mobile phone, a tiling display, and the like, but are not limited thereto.

A tiling display is exemplified below as a specific example of an electronic apparatus using the display device of the present disclosure. Note that the specific example exemplified here is merely an example, and the electronic apparatus is not limited to the specific example.

[Tiling Display]

FIG. 17 is a schematic view of a tiling display according to a specific example of an electronic apparatus of the present disclosure.

A tiling display 100 according to the present specific example is a display device formed by arranging nine display units (unit panels) 101 in total in 3×3 tiles. Here, the number of display units 101 is 3×3=9 in total, but may be any number.

In the tiling display 100, in a case where adjacent display units 101 do not have a similar gamma characteristic, a luminance difference occurs, resulting in degradation in image quality. Fine luminance adjustment is therefore necessary. Accordingly, the tiling display 100 according to the present specific example uses, as the display unit 101, the display device according to the embodiment described above in which the current-luminance characteristic is the gamma characteristic with the logarithmic curve. This makes it possible to control luminance at a ratio with respect to the luminance over an entire range of the light emission current. Then, for example, if luminance is adjustable at a luminance ratio of about 1.8%, the luminance difference becomes equal to or less than a noticeable luminance difference of a human eye, which makes it possible to configure a tiling display having superior image quality without a luminance difference between adjacent display units 101.

<Configuration Achievable by Employing Present Disclosure>

It is to be noted that the present disclosure may have the following configurations.

<<A. Display Device>>

[A-1]

A display device provided with a pixel circuit, the pixel circuit including:

a light-emitting element;

a current modulator that controls a current value flowing through the light-emitting element;

a current breaker that interrupts a current flowing through the light-emitting element; and a gray-scale controller that controls the current modulator and the current breaker to perform gray-scale control, the gray-scale controller discretely controlling a light emission duty of the light-emitting element through the current breaker, and controlling, through the current modulator, the current value flowing through the light-emitting element in accordance with the light emission duty of the light-emitting element.

[A-2]

The display device according to [A-1], in which the gray-scale controller discretely decreases the light emission duty of the light-emitting element at a constant rate, and controls the current value flowing through the light-emitting element accordingly.

[A-3]

The display device according to [A-2], in which the gray-scale controller controls the light emission duty of the light-emitting element and the current value flowing through the light-emitting element to approximate a current-luminance characteristic to a gamma characteristic with a logarithmic curve.

[A-4]

The display device according to any one of [A-1] to [A-3], in which the gray-scale controller uses only a specific current range of the light-emitting element other than a minimum light emission width of the light-emitting element.

[A-5]

The display device according to [A-4], in which the gray-scale controller performs chromaticity correction in a single color in a section of the specific current range of the light-emitting element.

[A-6]

The display device according to [A-5], in which the gray-scale controller performs the chromaticity correction in the single color with use of a technology of interpolation processing.

[A-7]

The display device according to [A-6], in which the gray-scale controller performs interpolation processing on current values at two or more points for the chromaticity correction in the single color.

[A-8]

The display device according to any one of [A-1] to [A-7], in which the current breaker includes a switch element coupled in series to the light-emitting element and the current modulator, and a duty controller that performs on/off control of the switch element, and the duty controller controls a light emission duty of the switch element on the basis of a duty control signal supplied from the gray-scale controller and a stepwise sawtooth wave signal.

[A-9]

The display device according to any one of [A-1] to [A-8], in which the gray-scale controller sets a change ratio of a light emission duty in one light emission in a light emission period in one frame when discretely controlling the light emission duty of the light-emitting element to a predetermined ratio or less.

[A-10]

The display device according to any one of [A-1] to [A-9], in which a rephotographing mode is provided in which light emission in one frame period is divided into a plurality of times and a light emission duty is not periodically changed.

[A-11]

The display device according to any one of [A-1] to [A-10], in which the light-emitting element includes a light-emitting diode.

<<B. Method of Driving Display Device>>

[B-1]

A method of driving a display device, the display device provided with a pixel circuit, the pixel circuit including
  a light-emitting element,
  a current modulator that controls a current value flowing through the light-emitting element, and
  a current breaker that interrupts a current flowing through the light-emitting element,
  the method of driving the display device including:
  for driving of the display device, discretely controlling a light emission duty of the light-emitting element by the current breaker, and controlling the current value flowing through the light-emitting element in accordance with the light emission duty of the light-emitting element by the current modulator, thereby performing gray-scale control.

[B-2]

The method of driving the display device according to [B-1], in which the light emission duty of the light-emitting element is discretely decreased at a constant rate, and the current value flowing through the light-emitting element is controlled accordingly.

[B-3]

The method of driving the display device according to [B-2], in which the light emission duty of the light-emitting element and the current value flowing through the light-emitting element are controlled to approximate a current-luminance characteristic to a gamma characteristic with a logarithmic curve.

[B-4]

The method of driving the display device according to any one of [B-1] to [B-3], in which only a specific current range of the light-emitting element is used other than a minimum light emission width of the light-emitting element.

[B-5]

The method of driving the display device according to [B-4], in which chromaticity correction in a single color is performed in a section of the specific current range of the light-emitting element.

[B-6]

The method of driving the display device according to [B-5], in which the chromaticity correction in the single color is performed with use of a technology of interpolation processing.

[B-7]

The method of driving the display device according to [B-6], in which interpolation processing on current values at two or more points is performed for the chromaticity correction in the single color.

[B-8]

The method of driving the display device according to any one of [B-1] to [B-7], in which a light emission duty of a switch element is controlled on the basis of a duty control signal and a stepwise sawtooth wave signal.

[B-9]

The method of driving the display device according to any one of [B-1] to [B-8], in which a change ratio of a light emission duty in one light emission in a light emission period in one frame when discretely controlling the light emission duty of the light-emitting element is set to a predetermined ratio or less.

[B-10]

The method of driving the display device according to any one of [B-1] to [B-9], in which a rephotographing mode is provided in which light emission in one frame period is divided into a plurality of times and a light emission duty is not periodically changed.

[B-11]

The method of driving the display device according to any one of [B-1] to [B-10], in which the light-emitting element includes a light-emitting diode.

<<C. Electronic Apparatus>>

[C-1]

An electronic apparatus including a display device provided with a pixel circuit, the pixel circuit including:
  a light-emitting element;
  a current modulator that controls a current value flowing through the light-emitting element;
  a current breaker that interrupts a current flowing through the light-emitting element; and
  a gray-scale controller that controls the current modulator and the current breaker to perform gray-scale control,
  the gray-scale controller discretely controlling a light emission duty of the light-emitting element through the current breaker, and controlling, through the current modulator, the current value flowing through the light-emitting element in accordance with the light emission duty of the light-emitting element.

[C-2]

The electronic apparatus according to [C-1], in which the gray-scale controller discretely decreases the light emission duty of the light-emitting element at a constant rate, and controls the current value flowing through the light-emitting element accordingly.

[C-3]

The electronic apparatus according to [C-2], in which the gray-scale controller controls the light emission duty of the light-emitting element and the current value flowing through the light-emitting element to approximate a current-luminance characteristic to a gamma characteristic with a logarithmic curve.

[C-4]

The electronic apparatus according to any one of [C-1] to [C-3], in which the gray-scale controller uses only a specific current range of the light-emitting element other than a minimum light emission width of the light-emitting element.

[C-5]

The electronic apparatus according to [C-4], in which the gray-scale controller performs chromaticity correction in a single color in a section of the specific current range of the light-emitting element.

[C-6]

The electronic apparatus according to [C-5], in which the gray-scale controller performs the chromaticity correction in the single color with use of a technology of interpolation processing.

[C-7]

The electronic apparatus according to [C-6], in which the gray-scale controller performs interpolation processing on current values at two or more points for the chromaticity correction in the single color.

[C-8]

The electronic apparatus according to any one of [C-1] to [C-7], in which the current breaker includes a switch element coupled in series to the light-emitting element and the current modulator, and a duty controller that performs on/off control of the switch element, and the duty controller controls a light emission duty of the switch element on the basis of a duty control signal supplied from the gray-scale controller and a stepwise sawtooth wave signal.

[C-9]

The electronic apparatus according to any one of [C-1] to [C-8], in which the gray-scale controller sets a change ratio of a light emission duty in one light emission in a light emission period in one frame when discretely controlling the light emission duty of the light-emitting element to a predetermined ratio or less.

[C-10]

The electronic apparatus according to any one of [C-1] to [C-9], in which a rephotographing mode is provided in which light emission in one frame period is divided into a plurality of times and a light emission duty is not periodically changed.

[C-11]

The electronic apparatus according to any one of [C-1] to [C-10], in which the light-emitting element includes a light-emitting diode.

REFERENCE SIGNS LIST

10: pixel circuit, 11: light-emitting element (LED), 12: current modulator, 13: switch element, 14: duty controller, 20: pixel array section, 30: scanner, 40: gray-scale controller, 50: sawtooth wave generator, 61 ($61_1$ to $61_m$): scanning line, 62 ($62_1$ to $62_m$), 63 ($63_1$ to $63_m$): control line, 100: tiling display, 101: display unit (unit panel)

What is claimed is:

1. A display device provided with a pixel circuit, the pixel circuit comprising:

a light-emitting element;

a current modulator that controls a current value flowing through the light-emitting element;

a current breaker that interrupts a current flowing through the light-emitting element; and a gray-scale controller that controls the current modulator and the current breaker to perform gray-scale control, wherein the gray-scale controller discretely controls a light emission duty of the light-emitting element through the current breaker, wherein, through the current modulator, the gray-scale controller controls current value flowing through the light-emitting element in accordance with the light emission duty of the light-emitting element, and wherein the gray-scale controller discretely decreases the light emission duty of the light-emitting element at a constant rate, and controls the current value flowing through the light-emitting element accordingly.

2. The display device according to claim 1, wherein the gray-scale controller controls the light emission duty of the light-emitting element and the current value flowing through the light-emitting element to approximate a current-luminance characteristic to a gamma characteristic with a logarithmic curve.

3. The display device according to claim 1, wherein the light-emitting element comprises a light-emitting diode.

4. A display device provided with a pixel circuit, the pixel circuit comprising:

a light-emitting element;

a current modulator that controls a current value flowing through the light-emitting element;

a current breaker that interrupts a current flowing through the light-emitting element; and a gray-scale controller that controls the current modulator and the current breaker to perform gray-scale control, wherein the gray-scale controller discretely controls a light emission duty of the light-emitting element through the current breaker, wherein, through the current modulator, the gray-scale controller controls current value flowing through the light-emitting element in accordance with the light emission duty of the light-emitting element, and wherein the gray-scale controller uses only a specific current range of the light-emitting element other than a minimum light emission width of the light-emitting element.

5. The display device according to claim 4, wherein the gray-scale controller performs chromaticity correction in a single color in a section of the specific current range of the light-emitting element.

6. The display device according to claim 5, wherein the gray-scale controller performs the chromaticity correction in the single color with use of a technology of interpolation processing.

7. The display device according to claim 6, wherein the gray-scale controller performs interpolation processing on current values at two or more points for the chromaticity correction in the single color.

8. The display device according to claim 4, wherein the light-emitting element comprises a light-emitting diode.

9. A display device provided with a pixel circuit, the pixel circuit comprising:

a light-emitting element;

a current modulator that controls a current value flowing through the light-emitting element;

a current breaker that interrupts a current flowing through the light-emitting element;

a gray-scale controller that controls the current modulator and the current breaker to perform gray-scale control, wherein the gray-scale controller discretely controls a light emission duty of the light-emitting element through the current breaker, wherein, through the current modulator, the gray-scale controller controls current value flowing through the light-emitting element in accordance with the light emission duty of the light-emitting element, wherein the current breaker includes a switch element coupled in series to the light-emitting element and the current modulator; and a duty controller that performs on/off control of the switch element, and wherein the duty controller controls a light emission duty of the switch element on a basis of a duty control signal supplied from the gray-scale controller and a stepwise sawtooth wave signal.

10. The display device according to claim 9, wherein the light-emitting element comprises a light-emitting diode.

11. A display device provided with a pixel circuit, the pixel circuit comprising: comprising:
a light-emitting element;
a current modulator that controls a current value flowing through the light-emitting element;
a current breaker that interrupts a current flowing through the light-emitting element; and
a gray-scale controller that controls the current modulator and the current breaker to perform gray-scale control,
wherein the gray-scale controller discretely controls a light emission duty of the light-emitting element through the current breaker,
wherein, through the current modulator, the gray-scale controller controls current value flowing through the light-emitting element in accordance with the light emission duty of the light-emitting element, and
wherein the gray-scale controller sets a change ratio of a light emission duty in one light emission in a light emission period in one frame when discretely controlling the light emission duty of the light-emitting element to a predetermined ratio or less.

12. The display device according to claim 11, wherein the light-emitting element comprises a light-emitting diode.

13. A display device provided with a pixel circuit, the pixel circuit comprising:
a light-emitting element;
a current modulator that controls a current value flowing through the light-emitting element;
a current breaker that interrupts a current flowing through the light-emitting element; and
a gray-scale controller that controls the current modulator and the current breaker to perform gray-scale control,
wherein the gray-scale controller discretely controls a light emission duty of the light-emitting element through the current breaker,
wherein, through the current modulator, the gray-scale controller controls current value flowing through the light-emitting element in accordance with the light emission duty of the light-emitting element, and
wherein a rephotographing mode is provided in which light emission in one frame period is divided into a plurality of times and a light emission duty is not periodically changed.

14. The display device according to claim 13, wherein the light-emitting element comprises a light-emitting diode.

* * * * *